(12) United States Patent
Kim et al.

(10) Patent No.: US 11,011,599 B2
(45) Date of Patent: May 18, 2021

(54) STRETCHABLE DISPLAY PANEL AND STRETCHABLE DISPLAY DEVICE INCLUDING THE SAME

(71) Applicant: LG Display Co., Ltd., Seoul (KR)

(72) Inventors: Eunah Kim, Seosan-si (KR); Hyunju Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/520,159

(22) Filed: Jul. 23, 2019

(65) Prior Publication Data
US 2020/0035778 A1    Jan. 30, 2020

(30) Foreign Application Priority Data
Jul. 26, 2018   (KR) ......................... 10-2018-0087313

(51) Int. Cl.
| | |
|---|---|
| *H01L 23/58* | (2006.01) |
| *H01L 21/46* | (2006.01) |
| *H01L 27/32* | (2006.01) |
| *H01L 51/00* | (2006.01) |
| *H01L 51/52* | (2006.01) |

(Continued)

(52) U.S. Cl.
CPC ...... *H01L 27/3293* (2013.01); *H01L 25/0655* (2013.01); *H01L 25/167* (2013.01); *H01L 51/0097* (2013.01); *H01L 51/5281* (2013.01); *H01L 2251/5338* (2013.01)

(58) Field of Classification Search
CPC ................ H01L 51/0097; H01L 2251/5338

USPC ........... 438/26, 118, 457; 257/643, 773, 792
See application file for complete search history.

(56) References Cited

U.S. PATENT DOCUMENTS

| | | | |
|---|---|---|---|
| 6,743,982 B2 * | 6/2004 | Biegelsen | ............... B25J 13/084 174/69 |
| 8,865,489 B2 * | 10/2014 | Rogers | .................... H01L 33/54 438/27 |

(Continued)

FOREIGN PATENT DOCUMENTS

| | | |
|---|---|---|
| CN | 10-2017-0088013 A | 8/2017 |
| CN | 107085481 A | 8/2017 |

(Continued)

*Primary Examiner* — Calvin Lee
(74) *Attorney, Agent, or Firm* — Seed IP Law Group LLP

(57) ABSTRACT

Disclosed herein are a stretchable display panel and a stretchable device. The stretchable display panel comprises: a lower substrate having an active area and a non-active area surrounding the active area; a plurality of individual substrates disposed on the lower substrate, spaced apart from each other and located in the active area; a connection line electrically connecting a pad disposed on the individual substrate; a plurality of pixels disposed on the plurality of individual substrates; and an upper substrate disposed above the plurality of pixels, wherein the modulus of elasticity of the individual substrates is higher than that of at least one part of the lower substrate. Accordingly, the stretchable display device according to the present disclosure may have a structure that enables the stretchable display device to be more easily deformed when a user stretches or bends the stretchable display device and that can minimize damage to the components of the stretchable display device when the stretchable display device is deformed.

26 Claims, 12 Drawing Sheets

(51) Int. Cl.
    *H01L 25/065*    (2006.01)
    *H01L 25/16*    (2006.01)

(56) References Cited

U.S. PATENT DOCUMENTS

| | | | | |
|---|---|---|---|---|
| 9,247,648 B2 * | 1/2016 | Vanfleteren | ......... | H05K 1/0283 |
| | | | | 361/749 |
| 9,841,548 B2 * | 12/2017 | Kim | ................. | G02B 6/0041 |
| | | | | 361/749 |
| 2014/0299362 A1 * | 10/2014 | Park | ................. | H05K 1/0283 |
| | | | | 174/254 |
| 2016/0360612 A1 | 12/2016 | Iwase et al. | | |
| 2017/0005077 A1 | 1/2017 | Kim et al. | | |
| 2020/0027945 A1 * | 1/2020 | Kim | ................ | H01L 27/3276 |
| 2020/0028102 A1 * | 1/2020 | Kim | ................ | H01L 51/5237 |
| 2020/0211437 A1 * | 7/2020 | Ahn | ................ | H01L 51/0097 |

FOREIGN PATENT DOCUMENTS

| | | |
|---|---|---|
| CN | 107710885 A | 2/2018 |
| CN | 110739333 A | 1/2020 |
| GB | 2576109 A | 2/2020 |
| GB | 2576425 A | 2/2020 |
| KR | 10-2016-0101825 A | 8/2016 |
| KR | 10-1768675 B1 | 8/2017 |
| WO | 2018/230940 A | 12/2018 |

* cited by examiner

STRETCHABLE DISPLAY PANEL AND STRETCHABLE DISPLAY DEVICE INCLUDING THE SAME

CROSS-REFERENCE TO RELATED APPLICATION

This application claims the priority of Korean Patent Application No. KR 10-2018-0087313 filed on Jul. 26, 2018, in the Korean Intellectual Property Office, the disclosure of which is incorporated herein by reference.

BACKGROUND

Technical Field

The present disclosure relates to a stretchable display panel and a stretchable device and, more particularly, to a stretchable display panel and a stretchable device that can more freely move when subjected to bending or stretching.

Description of the Related Art

An Organic Light Emitting Display (OLED) that emits light by itself, a Liquid Crystal Display (LCD) that uses separate light sources, etc., are used as the display devices used in a computer monitor, a TV, and a mobile phone.

Display devices are being used in more various fields including not only a computer monitor, TV, and personal mobile devices, and but also in a display device having a large display area with reduced volume and weight is being studied.

Recently, a stretchable display device manufactured to be able to stretch/contract in a specific direction and change into various shapes by forming a display unit, lines, etc., on a flexible substrate, such as a plastic that is a flexible material, has been spotlighted as a next generation display device.

BRIEF SUMMARY

An object of the present disclosure is to provide a stretchable display device that can stretch.

Another object of the present disclosure is to provide a stretchable display device in which a plurality of rigid substrates are disposed on a base substrate made of a pliant material and display elements are formed on each of the rigid substrates, thereby being able to form the display elements or drive the display elements without damaging the substrates while being stretchable.

Another object of the present disclosure is to provide a stretchable display device that can suppress damage of a stretchable display device due to overstretching by additionally disposing overstretching suppression areas on a base substrate made of a pliant material. Another object is to provide a high quality image from the display device while it is being stretched and also after is has been stretched and returned to its former shape.

Objects of the present disclosure are not limited to the above-mentioned objects, and other objects, which are not mentioned above, can be clearly understood by those skilled in the art from the following descriptions.

A stretchable display panel according to an aspect of the present disclosure may include: a lower substrate having an active area and a non-active area surrounding the active area; a plurality of individual substrates disposed on the lower substrate and located in the active area; a connection line electrically connecting a pad disposed on the individual substrate; a plurality of pixels disposed on the plurality of individual substrates; and an upper substrate disposed above the plurality of pixels, wherein the modulus of elasticity of the individual substrates is higher than that of at least one part of the lower substrate.

Other detailed matters of the exemplary embodiments are included in the detailed description and the drawings.

The present disclosure has an effect that display elements and transistors of a stretchable display device are easily bent or stretched without being damaged by stretch by spacing and disposing a plurality of second substrates made of a material that is more rigid than a first substrate, and which are spaced apart from each other by a predetermined distance. The second substrates are of a size on which one pixel can be formed and then positioned spaced apart from each other on a base substrate that has pliant in the locations between the rigid substrates. Transistors and display elements, such as organic light emitting elements can be formed on the second substrate made of a rigid material.

The present disclosure can minimize damage to a stretchable display device due to overstretching by disposing a plurality of second substrates made of a material, which is more rigid than a first substrate, on the first substrate and by additionally disposing substrate types or line types of overstretching suppression areas in spacing areas where each of the second substrates is spaced.

The present disclosure can suppress damage to connecting lines when a stretchable display device is stretched, by disposing overstretching suppression areas on the connecting lines to be overlapped the connecting lines.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
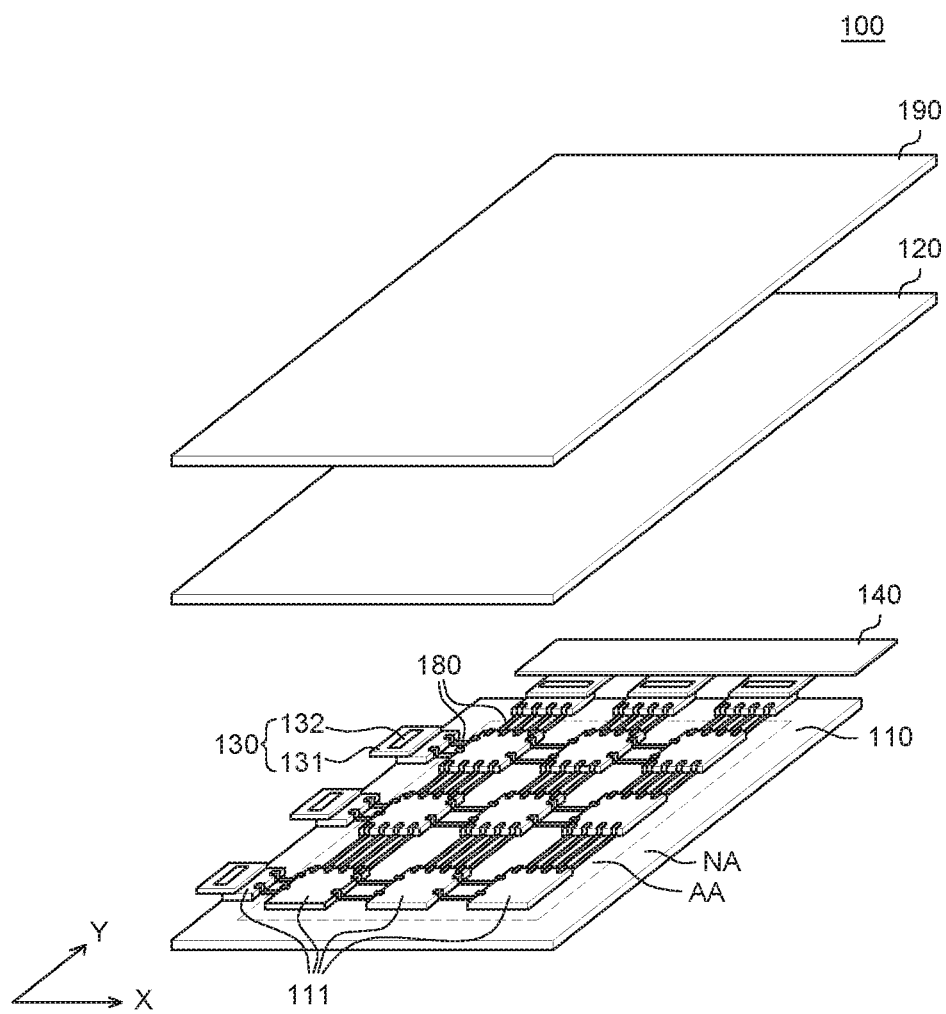
FIG. 1 is an exploded perspective view of a stretchable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

The description of spacing, dimensions and components is to be interpreted to include an ordinary tolerance for error range, even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

Stretchable Display Device

A stretchable display device may be referred to as a display device that can display images even if it bends or stretches. A stretchable display device can have high flexibility, as compared with common display devices of the related art. Accordingly, the shape of the stretchable display device can be freely changed in accordance with operation by the user such as bending or stretching the stretchable display device. For example, when a user holds and pulls an end of a stretchable display device, the stretchable display device can be stretched by the force of the user. Alternatively, when a user puts a stretchable display device on an uneven wall, the stretchable display device can be disposed to be bent in the surface shape of the wall. When the force applied by a user is removed, a stretchable display device can return into the initial shape.

FIG. 1 is an exploded perspective view showing a stretchable display device according to an embodiment of the present disclosure. Referring to FIG. 1, a stretchable display device 100 includes a lower substrate 110, a plurality of individual substrates 111, connecting lines 180, Chip on Films (COF) 130, a printed circuit board 140, an upper substrate 120, and a polarizing layer 190. An adhesive layer for bonding the lower substrate 110 and the upper substrate 120 are not shown in FIG. 1 for the convenience of description.

The lower substrate 110 is a substrate for supporting and protecting various components of the stretchable display device 100. The lower substrate 110, which is a flexible substrate, may be made of a bendable or stretchable insulating material. For example, the lower substrate 110 may be made of silicon rubber such as Polydimethylsiloxane (PDMS) or an elastomer such as Polyurethane (PU), so it can have flexibility. The material of the lower substrate 110, however, is not limited thereto.

The lower substrate 110, which is a flexible substrate, can reversibly expand and contract. The lower substrate 110 may have an elastic modulus of several to hundreds of MPa and a tensile fracture rate of 100% or more. The thickness of the lower substrate 110 may be 10 μm to 1 mm, but is not limited thereto.

The lower substrate 110 may have an active area AA and a non-active area NA surrounding the active area AA.

The active area AA is an area where images are displayed on the stretchable display device 100, and display elements and various driving elements for driving the display elements are disposed in the active area AA. The active area AA includes a plurality of pixels including a plurality of subpixels and the spaces between the pixels. The plurality of pixels are disposed in the active area AA and include a plurality of display elements. The plurality of subpixels each may be connected with various lines. For example, the plurality of subpixels each may be connected with various lines such as a gate line, a data line, a high-potential power line, a low-potential power line, and a reference voltage line.

The non-active area NA is an area adjacent to the active area AA. The non-active area NA is an area disposed adjacent to the active area AA. In some embodiments, the NA is surrounding the active area AA. The non-active area NA is an area where an image is not displayed, and lines and circuits may be disposed in the non-active area NA. For example, a plurality of pads may be disposed in the non-active area NA and the pads may be respectively connected with the plurality of subpixels in the active area AA.

The plurality of individual substrates 111 are disposed on the lower substrate 110. The plurality of individual substrates 111, which are hard substrates, is spaced apart from each other on the lower substrate 110. The plurality of individual substrates 111 may be harder than the lower substrate 110. That is, the lower substrate 110 may be more pliant than the plurality of individual substrates 111 and the plurality of individual substrates 111 may be harder than the lower substrate 110. When the first substrate 111 is stretched, the second substrates move a second distance apart from each other that is greater than the first selected distance. The connecting lines 180 provide electrical connection between the second substrates when they are the first distance apart from each other. When the first substrate 111 is stretched and the second substrates move a greater distance apart from each other, the connecting lines also stretch maintaining the electrical connections between the respective second substrates 112 to each other.

The plurality of individual substrates 111, which are the plurality of hard substrates, may be made of a plastic material having flexibility and, for example, may be made of polyimide (PI), polyacrylate, or polyacetate.

The modulus of elasticity of the plurality of individual substrates 111 may be higher than that of the lower substrate 110. The modulus is an elastic modulus showing the ratio of deformation of a substrate caused by stress to stress applied to the substrate, and when the modulus is relatively high, the hardness may be relatively high. Accordingly, the plurality of individual substrates 111 may be a plurality of hard substrates that are harder than the lower substrate 110. The modulus of elasticity of the plurality of individual substrates 111 may be a thousand times higher than that of the lower substrate 110, but are not limited thereto.

The connecting lines 180 are disposed between the plurality of individual substrates 111. The connecting lines 180 may be disposed between the pads disposed on the plurality of individual substrates 111 and may electrically connect the pads. The connecting lines 180 will be described in more detail with reference to FIG. 2.

The COFs 130, which are films having various components on flexible base films 131, are components for supplying signals to the plurality of subpixels in the active area AA. The COFs 130 may be bonded to the plurality of pads disposed in the non-active area NA and supply a power voltage, a data voltage, a gate voltage, etc., respectively, to the plurality of subpixels in the active area AA through the pads. The COFs 130 include a base film 131 and a driving IC 132 and in addition to those, the COFs 130 may include various other components.

The base films 131 are layers supporting the driving ICs 132 of the COFs 130. The base films 131 may be made of an insulating material, for example, an insulating material having flexibility.

The driving ICs 132 are components that process data for displaying images and driving signals for processing the data. Although the driving ICs 132 are mounted in the type of the COF (130) in FIG. 1, the driving ICs 132 are not limited thereto, and the driving ICs 132 may be mounted in the type of Chip On Glass (COG) or Tape Carrier Package (TCP).

Controllers such as an IC chip and a circuit may be mounted on the printed circuit board 140. A memory, a processor, etc., may also be mounted on the printed circuit board 140. The printed circuit board 140 transmits signals for driving the display elements from the controller to the display elements.

The printed circuit board 140 is connected with the COFs 130, so they can be electrically connected with the plurality of subpixels on the plurality of individual substrates 111.

The upper substrate 120 is a substrate overlapped with the lower substrate 110 to protect various components of the stretchable display device 100. The upper substrate 120, which is a flexible substrate, may be made of a bendable or stretchable insulating material. For example, the upper substrate 120 may be made of a flexible material that is the same as that of the lower substrate 110, but is not limited thereto.

The polarizing layer 190, which is a component suppressing external light reflection by the stretchable display device 100, may overlap the upper substrate 120 and may be disposed on the upper substrate 120. However, the polarizing layer 190 is not limited thereto and, may be disposed under the upper substrate 120, or may not be present at all, depending on the configuration of the stretchable display device 100.

Figure 2:
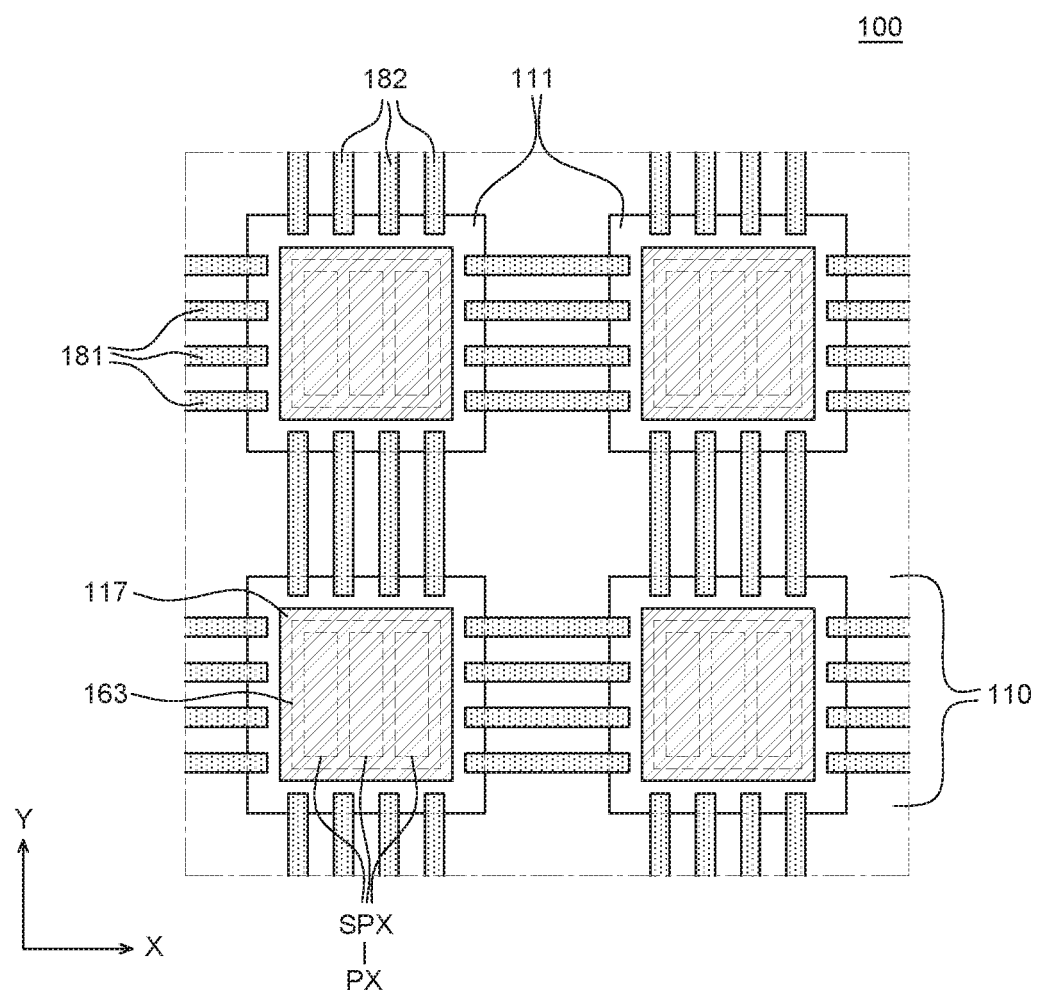
FIG. 2 is an enlarged plan view of the stretchable display device according to an embodiment of the present disclosure.
Figure 3:
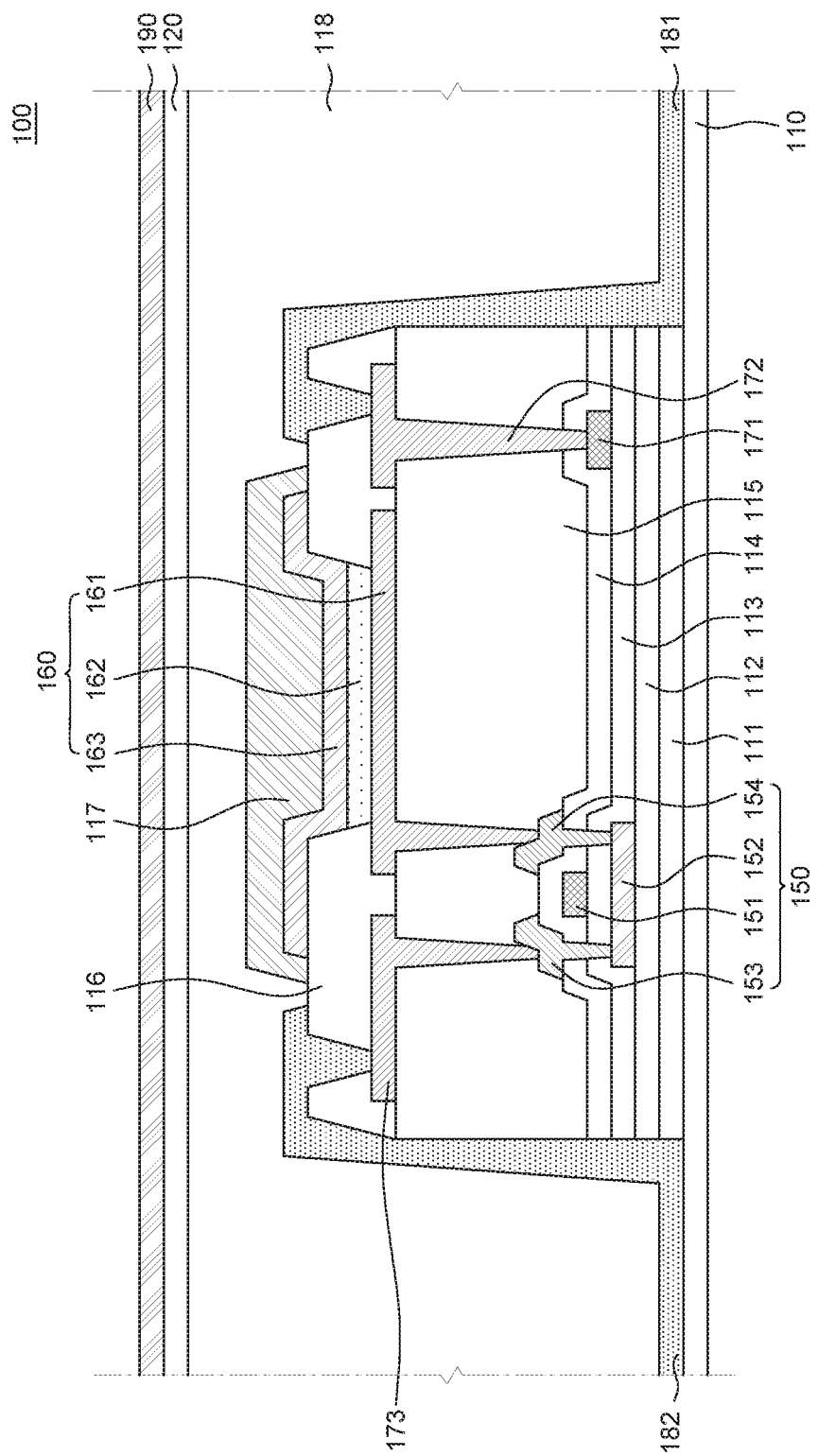
FIG. 3 is a cross-sectional view schematically showing one subpixel shown in FIG. 1.

FIGS. 2 and 3 are referred to hereafter to describe in more detail the stretchable display device 100 according to an embodiment of the present disclosure.

Planar & Cross-Sectional Structure

FIG. 2 is an enlarged plan view of the stretchable display device according to an embodiment of the present disclosure. FIG. 3 is a cross-sectional view schematically showing one subpixel shown in FIG. 1. FIG. 1 is referred to for the convenience of description.

Referring to FIGS. 2 and 3, the plurality of individual substrates 111 is disposed on the lower substrate 110. The plurality of individual substrates 111 are spaced apart from each other on the lower substrate 110. For example, the plurality of individual substrates 111, as shown in FIGS. 1 and 2, may be disposed in a matrix shape on the lower substrate 110, but are not limited thereto.

Referring to FIG. 3, a buffer layer 112 is disposed on the plurality of individual substrates 111. The buffer layer 112 is formed on the plurality of individual substrates 111 to protect various components of the stretchable display device 100 against permeation of water ($H_2O$), oxygen ($O_2$), etc., from the outside of the plurality of individual substances 111 and the lower substrate 110. The buffer layer 112 may be made of an insulating material, and for example, may be a single inorganic layer or a multi-inorganic layer made of a silicon nitride (SiNx), a silicon oxide (SiOx), silicon oxynitride (SiON), and the like. However, the buffer layer 112 may not be provided, depending on the structure of characteristics of the stretchable display device 100.

In this regard, the buffer layer 112 may be formed only in the areas overlapped with the plurality of individual substrates 111. As described above, since the buffer layers 112 may be made of an inorganic material, they may be easily damaged, such as cracking, when the stretchable display device 100 is stretched. Accordingly, the buffer layer 112 is patterned in the shape of the plurality of individual substrates 111 without being formed in the areas between the plurality of individual substrates 111, whereby it may be formed only on the plurality of individual substrates 111. Therefore, since the buffer layer 112 is formed only in the areas overlapped with the plurality of individual substrates 111 that are hard substrates, it is possible to suppress or avoid completely damage to the buffer layer 112 even though the stretchable display device 100 according to an embodiment of the present disclosure is deformed, such as, bending or stretching.

Referring to FIG. 3, a transistor 150 including a gate electrode 151, an active layer 152, a source electrode 153, and a drain electrode 154 is formed on the buffer layer 112. For example, the active layer 152 is formed on the buffer layer 112, and a gate insulating layer 113 for insulating the active layer 152 and the gate electrode 151 from each other is formed on the active layer 152. An inter-layer insulating layer 114 is formed to insulate the gate electrode 151, the source electrode 153, and the drain electrode 154, and the source electrode 153 and the drain electrode 154 that are in contact with the active layer 152, respectively, are formed on the inter-layer insulating layer 114.

The gate insulating layer 113 and the inter-layer insulating layer 114 may be formed only in the areas overlapped with the plurality of individual substrates 111 by patterning. The gate insulating layer 113 and the inter-layer insulating layer 114 may also be made of an inorganic material, similar to the buffer layer 112, so they may be easily damaged such as cracking when the stretchable display device 100 is stretched. Accordingly, the gate insulating layer 113 and the inter-layer insulating layer 114 are patterned in the shape of the plurality of individual substrates 111 without being formed in the areas between the plurality of individual substrates 111, whereby they can be formed only on the plurality of individual substrates 111.

Only a driving transistor of various transistors that may be included in the stretchable display device 100 is shown in FIG. 3 for the convenience of description, but a switching transistor, a capacitor, etc., may be included in the display device. Further, although the transistor 150 is described as having a coplanar structure in the present disclosure, various transistors, for example, having a staggered structure may be used.

Referring to FIG. 3, a gate pad 171 is disposed on the gate insulating layer 113. The gate pad 171 is a pad for transmitting a gate signal to a plurality of subpixels SPX. The gate pad 171 may be made of the same material as the gate electrode 151, but is not limited thereto.

Referring to FIG. 3, a planarization layer 115 is formed on the transistor 150 and the inter-layer insulating layer 114. The planarization layer 115 planarizes the top of the transistor 150. The planarization layer 115 may be composed of a single layer or a plurality of layers and may be made of an organic material. For example, the planarization layer 115 may be made of an acrylic-based organic material, but is not limited thereto. The planarization layer 115 may have a contact hole for electrically connecting the transistor 150 and an anode 161, a contact hole for electrically connecting a data pad 173 and the source electrode 153, and a contact hole for electrically connecting a connecting pad 172 and a gate pad 171.

In some embodiments, a passivation layer may be formed between the transistor 150 and the planarization layer 115. That is, the passivation layer covering the transistor 150 may be formed to protect the transistor 150 from permeation of water, oxygen, and the like. The passivation layer may be made of an inorganic material and may be composed of a single layer or a plurality of layers, but is not limited thereto.

Referring to FIG. 3, the data pad 173, the connecting pad 172, and an organic light emitting element 160 are disposed on the planarization layer 115.

The data pad 173 may transmit a data signal from a connecting line 180, which functions as a data line, to a plurality of subpixels SPX. The data pad 173 is connected with the source electrode 153 of the transistor 150 through a contact hole formed at the planarization layer 115. The data pad 173 may be made of the same material as the anode 161 of the organic light emitting element 160, but is not limited thereto. The data pad 173 may be made of the same material as the source electrode 153 and the drain electrode 154 of the transistor 150, not on the planarization layer 115, but on the inter-layer insulating layer 114.

The connecting pad 172 may transmit a gate signal from a connecting line 180, which functions as a gate line, to a plurality of subpixels SPX. The connecting pad 172 is connected with the gate pad 171 through contact holes formed at the planarization layer 115 and the inter-layer insulating layer 114 and transmits a gate signal to the gate pad 171. The connecting pad 172 may be made of the same material as the data pad 173, but is not limited thereto.

The organic light emitting elements 160 are components disposed to correspond to a plurality of subpixel SPX, respectively, and emitted light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the stretchable display device 100 may further include a color filter.

The organic light emitting element 160 includes an anode 161, an organic light emitting layer 162, and a cathode 163. In detail, the anode 161 is disposed on the planarization layer 115. The anode 161 is an electrode constituted for supplying holes to the organic light emitting layer 162. The anode 161 may be made of a transparent conductive material with a high work function. The transparent conductive material may include an Indium Tin Oxide (ITO), an Indium Zinc Oxide (IZO), or an Indium Tin Zinc Oxide (ITZO). The anode 161 may be made of the same material as the data pad 173 and the connecting pad 172 disposed on the planarization layer 151, but is not limited thereto. When the stretchable display device 100 is implemented in a top emission type, the anode 161 may further include a reflective plate.

The anodes 161 are spaced apart from each other respectively for subpixels SPX and electrically connected with the transistor 150 though contact holes of the polarization layer 115. For example, although the anode 161 is electrically connected with the drain electrode 154 of the transistor 150 in FIG. 3, the anode 161 may be electrically connected with the source electrode 153.

A bank 116 is formed on the anode 161, the data pad 173, the connecting pad 172, and the planarization layer 115. The bank 116 is a component separating adjacent subpixels SPX. The bank 116 is disposed to cover at least partially both sides of adjacent anodes 161, thereby partially exposing the top surfaces of the anode 161. The bank 116 may perform a role in suppressing the problem that an unexpected subpixel SPX emits light or colors are mixed by light emitted in the lateral direction of the anode 161 due to concentration of a current on the edge of the anode 161. The bank 116 may be made of acrylic-based resin, benzocyclobutene (BCB)-based resin, or polyimide, but is not limited thereto.

The bank 116 has a contact hole for connecting a connecting line 180 functioning as a data line and a data pad 173 and a contact hole for connecting a connecting line 180 functioning as a gate line and the connecting pad 172.

The organic light emitting layer 162 is disposed on the anode 161. The organic light emitting layer 162 is constituted for emitting light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with charge generation layers therebetween. The organic light emitting layer 162 may further include at least one organic layer of a hole transporting layer, an electron transporting layer, a hole blocking layer, an electrode blocking layer, a hole injection layer, and an electron injection layer.

Referring to FIGS. 2 and 3, the cathode 163 is disposed on the organic light emitting layer 162. The cathode 163 supplies electrons to the organic light emitting layer 162. The cathode 163 may be made of Indium Tin Oxide (ITO)-based, Indium Zinc Oxide (IZO)-based, Indium Tin Zinc Oxide (ITZO)-based, Zinc Oxide (ZnO)-based, or Tin Oxide (TO)-based transparent conductive oxides or an Ytterbium (Yb) alloy. Alternatively, the cathode 163 may be made of a metal material.

The cathodes 163 may be formed by pattering to respectively overlap the plurality of individual substrates 111. That is, the cathodes 163 may be disposed not in the areas between the plurality of individual substrates 111, but only in the areas overlapped with the plurality of individual substrates 111. Since the cathodes 163 are made of a material, such as, a transparent conductive oxide, a metal material, and the like, when the cathodes 163 are formed even in the areas between the plurality of individual substrates 111, the cathodes 163 may be damaged when the stretchable display device 100 is stretched/contracted. Accordingly, the cathodes 163 may be formed to respectively correspond to the individual substrates 111 on the plane. Referring to FIGS. 2 and 3, the cathodes 163 may be formed to have an area not overlapped with the area where a connection line 180 is disposed, of the areas overlapped with the plurality of individual substrates 111.

Unlike common organic light emitting display devices, the cathodes 163 are formed by patterning to correspond to the plurality of individual substrate 111 in the stretchable display device 100 according to an embodiment of the present disclosure. Accordingly, the cathodes 163 disposed on the plurality of individual substrates 111 can be independently supplied with low-potential power through the connection lines 180.

Referring to FIGS. 2 and 3, an encapsulation layer 117 is disposed on the organic light emitting element 160. The encapsulation layer 117 can seal the organic light emitting element 160 by covering the organic light emitting element 160 in contact with a portion of the top surface of the bank 116. Accordingly, the encapsulation layer 117 protects the organic light emitting element 160 from water, air, or physical shock that may be applied from the outside.

The encapsulation layers 117 respectively cover the cathodes 163 areas to respectively overlap the plurality of individual substrate 111 and may be formed on the plurality of individual substrates 111, respectively. That is, the encapsulation layer 117 is disposed to cover one cathode 163 disposed on one individual substrate 111 and the encapsulation layers 117 respectively disposed on the individual substrates 111 may be spaced apart from each other.

The encapsulation layer 117 may be formed only in the areas overlapped with the plurality of individual substrates 111. As described above, since the encapsulation layers 117 may be constituted to include an inorganic layer, they may be easily damaged, such as cracking, when the stretchable display device 100 is stretched. In particular, since the organic light emitting element 160 is vulnerable to water or oxygen, when the encapsulation layer 117 is damaged, reliability of the organic light emitting element 160 may be reduced. Therefore, since the encapsulation layer 117 is not formed in the areas between the plurality of individual substrates 111, damage to the encapsulation layer 117 can be minimized even though the stretchable display device 100 according to an embodiment of the present disclosure is deformed, such as, bending or stretching.

Compared with common flexible organic light emitting display devices of the related art, the stretchable display device 100 according to an embodiment of the present disclosure has a structure in which the plurality of individual substrates 111 that are relatively hard are disposed and spaced apart from each other on the lower substrate 110 that is relatively pliant. The cathodes 163 and the encapsulation layers 117 of the stretchable display device 100 are patterned to correspond to the plurality of individual substrates 111, respectively. That is, the stretchable display device 100 according to an embodiment of the present disclosure may have a structure that enables the stretchable display device 100 to be more easily deformed when a user stretches or bends the stretchable display device 100 and that can minimize damage to the components of the stretchable display device 100 when the stretchable display device 100 is deformed.

Connecting Line Composed of Base Polymer & Conductive Particle

The connecting lines 180 are lines that electrically connect the pads on the plurality of individual substrates 111. The connecting lines 180 include first connecting lines 181 and second connecting lines 182. In the connecting lines 180, the first connecting lines 181 are lines extending in an X-axial direction and the second connecting lines 182 are lines extending in a Y-axial direction.

In common organic light emitting display devices, various lines such as a plurality of gate lines and a plurality of data lines are extended and disposed between a plurality of subpixels, and a plurality of subpixels are connected to one signal line. Accordingly, in common organic light emitting display devices, various lines such as gate lines, data lines, high-potential power lines, and reference voltage lines extend from a side to the other side of the organic light emitting display devices without disconnecting on the substrate.

However, in the stretchable display device 100 according to an embodiment of the present disclosure, various lines such as gate lines, data lines, high-potential power lines, and reference voltage lines, which are made of a metal material, are disposed only on the plurality of individual substrates 111. That is, in the stretchable display device 100 according to an embodiment of the present disclosure, various lines made of a metal material may be disposed only on the plurality of individual substrates 111 not in contact with the lower substrate 110. Accordingly, various lines may be patterned to correspond to the plurality of individual substrates 111 and discontinuously disposed.

In the stretchable display device 100 according to an embodiment of the present disclosure, the pads on two adjacent individual substrates 111 may be connected by a connecting line 180 to connect the discontinuous lines. That is, a connecting line 180 electrically connects the pads on two adjacent individual substrates 111. Accordingly, the stretchable display device 100 of the present disclosure includes a plurality of connecting lines 180 to electrically connect various lines such as gate lines, data lines, high-potential power lines, and reference voltage lines between the plurality of individual substrates 111. For example, gate lines may be disposed on the plurality of individual substrates 111 disposed adjacent to each other in the X-axial direction, and the gate pads 171 may be disposed at both ends of the gate lines. Each of the plurality of gate pads 171 on the plurality of individual substrates 111 disposed adjacent to each other in the X-axial direction can be connected to each other by a connecting line 180 functioning as a gate line. Accordingly, the gate lines disposed on the plurality of individual substrates 111 and the connecting lines 180 disposed on the lower substrate 110 can function as one gate line. All various lines that can be included in the stretchable display device 100, such as the data lines, high-potential power lines, and reference voltage lines, also may function as one line by a connection line 180, as described above.

Referring to FIG. 2, a first connecting line 181 may connect the pads on two parallel individual substrates 111 of the pads of the plurality of individual substrates 111 disposed adjacent to each other in the X-axial direction. The first connecting line 181 may function as a gate line or a low-potential power line, but is not limited thereto. For example, the first connecting line 181 may function as a gate line and may electrically connect the gate pads 171 on two X-axially parallel individual substrates 111 through a contact hole formed at the bank 116. Accordingly, as described above, the gate pads 171 on a plurality of individual substrates 111 disposed in the X-axial direction may be connected by first connecting lines 181 that function as gate lines, and one gate signal may be transmitted.

Referring to FIG. 2, a second connecting line 182 may connect the pads on two parallel individual substrates 111 of the pads on the plurality of individual substrates 111 disposed adjacent to each other in the Y-axial direction. The second connecting line 182 may function as a data line, a high-potential power line, or a reference voltage line, but is not limited thereto. For example, the second connecting line 182 may function as a data line and may electrically connect the data pads 173 on two Y-axially parallel individual substrates 111 through a contact hole formed at the bank 116. Accordingly, as described above, the data pads 173 on the plurality of individual substrates 111 disposed in the Y-axial direction may be connected by the second connecting lines 182 that function as data lines, and one data signal may be transmitted.

Referring to FIG. 2, the connecting line 180 includes a base polymer and conductive particles. In detail, the first connecting line 181 includes a base polymer and conductive particles and the second connecting line 182 includes a base polymer and conductive particles.

The first connecting line 181 may be formed by extending to the top surface of the lower substrate 110 in contact with the top surface and a side of the bank 116, and sides of the planarization layer 115, the inter-layer insulating layer 114, and the buffer layer 112, which are disposed on the individual substrate 111, and sides of the plurality of individual substrates 111. Accordingly, the first connecting line 181 may be in contact with the top surface of the lower substrate 110, a side of an adjacent individual substrate 111, and sides of the buffer layer 112, the gate insulating layer 113, the inter-layer insulating layer 114, the planarization layer 115, and the bank 116 disposed on the adjacent individual substrate 111. The first connecting line 181 may be in contact with the connecting pads 172 disposed on adjacent individual substrates 111, but is not limited thereto.

The base polymer of the first connecting line 181, similar to the lower substrate 110, may be made of a bendable or stretchable insulating material. The base polymer, for example, may include Styrene Butadiene Styrene (SBS) etc., but is not limited thereto. Accordingly, when the stretchable display device 100 is bent or stretched, the base polymer may not be damaged. The base polymer may be formed by coating a material for the base polymer or applying the material using a slit on the lower substrate 110 and an individual substrate 111. The connecting lines 180 are pliant and have modulus of elasticity that is substantially less than the modulus of elasticity of the second substrates 112. In one embodiment, it is greater than the modulus of elasticity of the first substrate 111. It might be, in some examples, the modulus of elasticity of the connecting lines 180 might be 5 to 10 times greater than that of the first substrate 111, while in other embodiments, it might be 10 to 100 times greater.

The conductive particles of the first connecting line 181 may be distributed in the base polymer. In detail, the first connecting line 181 may include conductive particles distributed with predetermined density in the base polymer. The first connecting line 181, for example, may be formed by uniformly stirring conductive particles in a base polymer and then coating and hardening the base polymer with the conductive particles distributed therein onto the lower substrate 110 and the individual substrate 111, but is not limited thereto. The conductive particles may include at least one of silver (Ag), gold (Au), and carbon, but is not limited thereto.

The conductive particles disposed and distributed in the base polymer of the first connecting line 181 may form a conductive path electrically connecting the connecting pads 172 disposed on adjacent individual substrate 111. Further, the conductive particles may form a conductive path by electrically connecting a gate pad 171 formed on the outermost individual substrate 111 of the plurality of individual substrates 111 to a pad disposed in the non-active area NA.

Referring to FIG. 2, the base polymer of the first connecting line 181 and the conductive particles distributed in the base polymer may connect in a straight shape between the pads disposed on adjacent individual substrates 111. To this end, the base polymers may be formed in a straight shape connecting the pads disposed on the plurality of individual substrates 111 in the manufacturing process. Accordingly, the conductive paths formed by the conductive particles distributed in the base polymers also may be in a straight shape. However, the shape and the process of forming the base polymer and the conductive particles of the first connecting line 181 may not be limited thereto.

Referring to FIG. 2, the second connecting line 182 may be formed by extending to the top surface of the lower substrate 110 in contact with the top surface and a side of the bank 116, and sides of the planarization layer 115, the inter-layer insulating layer 114, and the buffer layer 112, which are formed on the individual substrate 111, and sides of the plurality of individual substrates 111. Accordingly, the second connecting line 182 may be in contact with the top surface of the lower substrate 110, a side of an adjacent individual substrate 111, and sides of the buffer layer 112, the gate insulating layer 113, the inter-layer insulating layer 114, the planarization layer 115, and the bank 116 disposed on the adjacent individual substrate 111. The second connecting line 182 may be in contact with the data pads 173 disposed on adjacent individual substrates 111, but is not limited thereto.

The base polymer of the second connecting line 182 may be made of a bendable or stretchable insulating material, similar to the lower substrate 110, and may be made of the same material as the base polymer of the first connecting line 181. The base polymer, for example, may include Styrene Butadiene Styrene (SBS) etc., but is not limited thereto.

The conductive particles of the second connecting line 182 may be distributed in the base polymer. In detail, the second connecting line 182 may include conductive particles distributed with predetermined density in the base polymer. The conductive particles distributed at the upper portion and the lower portion in the base polymer of the second connecting line 182 may be substantially the same in density. The manufacturing process of the second connecting line 182 may be the same as that of the first connecting line 181 or may be simultaneously performed.

The conductive particles disposed and distributed in the base polymer of the second connecting line 182 may form a conductive path electrically connecting the data pads 173 disposed, respectively, on adjacent individual substrate 111. Further, the conductive particles may form a conductive path by electrically connecting a data pad 173 formed on the outermost individual substrate 111 of the plurality of individual substrates 111 to a pad disposed in the non-active area NA.

Referring to FIG. 2, the base polymer of the second connecting line 182 and the conductive particles distributed in the base polymer may connect, in a straight shape, the pads disposed on adjacent individual substrates 111. To this end, the base polymers may be formed in a straight shape connecting between the pads disposed, respectively, on the plurality of individual substrates 111 in the manufacturing process. Accordingly, the conductive paths formed by the conductive particles distributed in the base polymers also may be in a straight shape. However, the shape and the process of forming the base polymer and the conductive particles of the second connecting line 182 may not be limited thereto.

In some embodiments, the conductive particles distributed in the base polymer of the connecting line 180 may be disposed and distributed with a density gradient in the base polymer. The density of conductive particles decreases as it goes from the upper portion to the lower portion of a base polymer, so conductivity by conductive particles may be maximum at the upper portion of a base polymer. In detail, conductive particles may be injected and distributed in a base polymer by performing ink printing, which uses conductive precursors, etc., on the top surface of the base polymer. When the conductive particles are injected into the base polymer, the conductive particles may permeate into an empty space of the base polymer while the polymer swells several times. Thereafter, the connecting line 180 may be formed by dipping the base polymer with the conductive particles injected into a reducing material or by reducing the base polymer by vapor. Accordingly, the density of the conductive particles in a permeation area at the upper portion of the base polymer may be high such that a conductive path may be formed. The thickness of the permeation area with conductive particles distributed with high density at the upper portion of the base polymer may depend on the time and intensity for injecting the conductive particles through the top surface of the base polymer. For example, when the time or intensity for injecting the conductive particles through the top surface of the base polymer increases, the thickness of the permeation area may increase. The conductive particles may be in contact with each other at the upper portion of the base polymer, so a conductive path is formed by the conductive particles being in contact with each other, and accordingly, an electrical signal may be transmitted.

In some embodiments, the base polymer of the connecting line 180 may be formed as a single layer between adjacent individual substrates 111 on the lower substrate 110. In detail, a base polymer, unlike FIG. 2, may be disposed as a single layer in the area between individual substrates 111, which are most adjacent to each other in the X-axial direction, in contact with the lower substrate 110. The base polymer may be formed to overlap all of a plurality of pads disposed in parallel at a side on one individual substrate 111. The conductive particles may be separately formed to form a plurality of conductive paths in a base polymer, which is one layer, and respectively correspond to a plurality of pads. Accordingly, the conductive paths formed by the conductive particles may connect in a straight shape between the pads disposed on adjacent individual substrates 111. For example, the conductive particles may be injected to form four conductive paths on the base polymer disposed as one layer between the plurality of individual substrates 111.

In some embodiments, the base polymers of the connecting lines 180 may be disposed in all areas excepting the areas where a plurality of individual substrates 111 is disposed. The base polymers may be disposed as single layers in contact with the lower substrate 110, on the plurality of pliant substrates of the lower substrate 110, that is, in the other areas excepting the areas overlapped with the plurality of individual substrates 111. Accordingly, since the other areas of the lower substrate 110 excepting the areas overlapped with the plurality of individual substrates 111 in the lower substrate 110 may be covered with base polymers and the base polymers may be in contact with the pads of the plurality of individual substrates 111, some of the base polymers may be disposed to cover edges of the plurality of individual substrates 111. The conductive particles may form a conductive path connecting the pads on the plurality of adjacent individual substrates 111 on the base polymer.

When base polymers are disposed as single layers in all areas excepting the areas having a plurality of individual substrates 111 on the lower substrate 110, the base polymers may be formed by being applied to all areas excepting the areas having the plurality of individual substrates 111 on the lower substrate 110. Accordingly, there may be no need for a separate process for patterning the base polymer. Accordingly, the process of manufacturing the base polymers and the connecting lines can be simplified, and the manufacturing costs and time can be reduced.

Since base polymers are disposed as single layers in all areas excepting the areas having a plurality of individual substrates 111 on the lower substrate 110, the force that is applied when the stretchable display device 100 is bent or stretched may be distributed. In some embodiments, the top surface of the base polymer of the connecting line 180 may be flat. In detail, unlike FIG. 3, the top surface of the base polymer of the connecting line 180 such as a gate line and a data line may be higher than the top surface of the planarization layer 115 on the plurality of individual substrates 111. The top surface of the base polymer may be higher than the top surface of the bank 116 on the plurality of individual substrates 111. Accordingly, for the base polymer of the connecting line 180, the height of the top surface of the portion overlapped with the plurality of individual substrates 111 and the height of the top surface of the areas disposed between the plurality of individual substrates 111 may be the same. Accordingly, the top surface of the connecting line 180 may be flat. Therefore, the top surface of the conductive particles distributed at the upper portion in the base polymer may be in a straight shape without a curve on the cross-sectional diagram.

A step may exist between the top surface of the bank 116 and the top surface of the lower substrate 110 due to various components on the plurality of individual substrates 111 spaced apart from each other on the lower substrate 110. In this case, the base polymer itself may be cut by a step on the top surface of the base polymer, so the electrical path between the pads disposed on adjacent individual substrates 111 may be cut and a percentage defective of the stretchable display device may increase.

When the top surface of the base polymer is flat, the step between the top surface of the elements disposed on the plurality of individual substrates 111 and the top surface of the lower substrate 110 without the plurality of individual substrates 111 may be removed. Accordingly, cutting of the connecting lines 180 including a base polymer and conductive particles due to a step may be suppressed even though the stretchable display device 100 is bent or stretched. Further, the top surface of a base polymer is flat in a stretchable display device 100 according to another embodiment of the present disclosure, so damage to the connecting lines 180 in the manufacturing process of the stretchable display device 100 can be minimized.

Referring back to FIG. 3, the upper substrate 120, the polarizing layer 190, and the adhesive layer 118 are disposed on the encapsulation layer 117 and the lower substrate 110.

The upper substrate 120 is a substrate supporting various components disposed under the upper substrate 120. The upper substrate 120, which is a flexible substrate, may be made of a bendable or stretchable insulating material. The upper substrate 120, which is a flexible substrate, may reversibly expand and contract. The upper substrate 120 may have an elastic modulus of several to hundreds of MPa and a tensile fracture rate of 100% or more. The thickness of the upper substrate 120 may be 10 μm to 1 mm, but is not limited thereto.

The upper substrate 120 may be made of the same material as the lower substrate 110, for example, silicon rubber such as polydimethylsiloxane (PDMS) or an elastomer such as polyurethane (PU), so it can have flexibility. The material of the upper substrate 120, however, is not limited thereto.

The upper substrate 120 and the lower substrate 110 may be bonded through the adhesive layer 118 disposed under the upper substrate 120 by applying pressure to the upper substrate 120 and the lower substrate 110. However, the present disclosure is not limited thereto, and the adhesive layer 118 may not be provided, depending on embodiments.

The polarizing layer 190 is disposed on the upper substrate 120. The polarizing layer 190 may polarize light incident into the stretchable display device 100 from the outside. Light incident and polarized in the stretchable display device 100 through the polarizing layer 190 may be reflected in the stretchable display device 100, so the phase of the light may be changed. The light with the changed phase may not pass through the polarizing layer 190. Accordingly, light incident in the stretchable display device 100 from the outside of the stretchable display device 100 is not discharged back to the outside of the stretchable display device 100, so the external light reflection of the stretchable display device 100 may be reduced.

Stretching Characteristic by Plurality of Individual Substrates

A stretchable display device needs an easily bending or stretching characteristic, so there have been attempts to use substrates that have a flexible property due to a low modulus of elasticity. However, when a flexible material such as polydimethylsiloxane (PDMS) having a low modulus of elasticity is used as a lower substrate that is disposed in the process of manufacturing a display device, there is a problem that the substrate is damaged by high temperature, for example, temperature over 100° C. that is generated in the process of forming transistors and display elements due to the characteristic that a material having a low modulus is weak to heat.

Accordingly, display elements should be formed on a substrate made of a material that can withstand high temperature, so damage to the substrate can be avoided in the process of manufacturing the display elements. Accordingly, there have been attempts to manufacture a substrate using materials that can withstand high temperature, which is generated in the manufacturing process, such as polyimide (PI). However, the materials that can withstand high temperature have high moduli, so substrates are not easily bent or stretched when stretching the stretchable display devices because the materials do not have flexible properties.

Therefore, since the plurality of individual substrates 111 that are hard substrates are disposed only in the areas where transistors 150 or organic light emitting elements 160 are disposed in the stretchable display device 100 according to an embodiment of the present disclosure, damage to the lower substrate 110 due to high temperature in the process of manufacturing the transistors 150 or the organic light emitting elements 160 may be suppressed.

Further, the lower substrate 110 and the upper substrate 120 that are flexible substrates are disposed under and over the plurality of individual substrates 111 in the stretchable display device 100 according to an embodiment of the present disclosure. Accordingly, the other areas of the lower substrate 110 and the upper substrate 120 excepting the areas overlapped with the plurality of individual substrates 111 can be easily stretched or bent, so the stretchable display device 100 may be achieved. Further, it is possible to avoid the damage of the stretchable display device 100 by the transistors 150, the organic light emitting elements 160, etc., disposed on the plurality of individual substrates 111 that are hard substrates when the stretchable display device 100 is bent or stretched.

Effect of Connecting Line

When a stretchable display device is bent or stretched, a lower substrate that is a flexible substrate is deformed and individual substrates that are hard substrates on which organic light emitting elements are disposed may not be deformed. In this case, if the lines connecting the pads disposed on the plurality of individual substrates are not made of an easily bendable or stretchable material, the lines may be damaged, such as cracking, due to deformation of the lower substrate.

However, in the stretchable display device 100 according to an embodiment of the present disclosure, it is possible to electrically connect the pads disposed on the plurality of individual substrates 111, using the connecting lines 180 including a base polymer and conductive particles. The base polymer is pliant to be easily deformed. Accordingly, according to the stretchable display device 100 of an embodiment of the present disclosure, even though the stretchable display device 100 is deformed such as bending or stretching, the areas between the individual substrates 111 are easily deformed by the connecting lines 180 including the base polymer are disposed.

Further, according to the stretchable display device 100 of an embodiment of the present disclosure, since the connecting lines 180 include conductive particles, the conductive paths composed of the conductive particles cannot be damaged such as cracking even by deformation of the base polymer. For example, when the stretchable display device 100 is deformed such as bending or stretching, the lower substrate 110 that is a flexible substrate may be deformed in the other areas excepting the areas where the plurality of individual substrates 111 that are hard substrates are disposed. The distance between the plurality of conductive particles disposed on the deforming lower substrate 110 may be changed. The density of the plurality of conductive particles disposed at the upper portion of the base polymers and forming the conductive paths may be maintained at a high level to be able to transmit electrical signals even though the distance between the conductive particles is increased. Accordingly, even if the base polymers are bent or stretched, the conductive paths formed by the plurality of conductive particles will continue to smoothly transmit electrical signals. Further, even though the stretchable display device 100 is deformed such as bending or stretching, electrical signals may be transmitted between the pads.

In the stretchable display device 100 according to an embodiment of the present disclosure, since the connecting lines 180 include a base polymer and conductive particles, the connecting lines 180 connecting the pads disposed on the plurality of adjacent individual substrates 111 may be disposed in a straight shape to have a minimum length. That is, the stretchable display device 100 may be achieved even if the connecting lines 180 are not curved. The conductive particles of the connecting lines 180 are distributed in the base polymers and form conductive paths. When the stretchable display device 100 is deformed such as bending or stretching, the conductive paths formed by the conductive particles may be bent or stretched. In this case, only the distance between the conductive particles is changed and the conductive paths formed by the conductive particles can still transmit electrical signals. Therefore, in the stretchable display device 100 according to an embodiment of the present disclosure, it is possible to minimize the space occupied by the connecting lines 180.

Lower Substrate Including Plurality of Hard Areas & Flexible Areas

Figure 4:
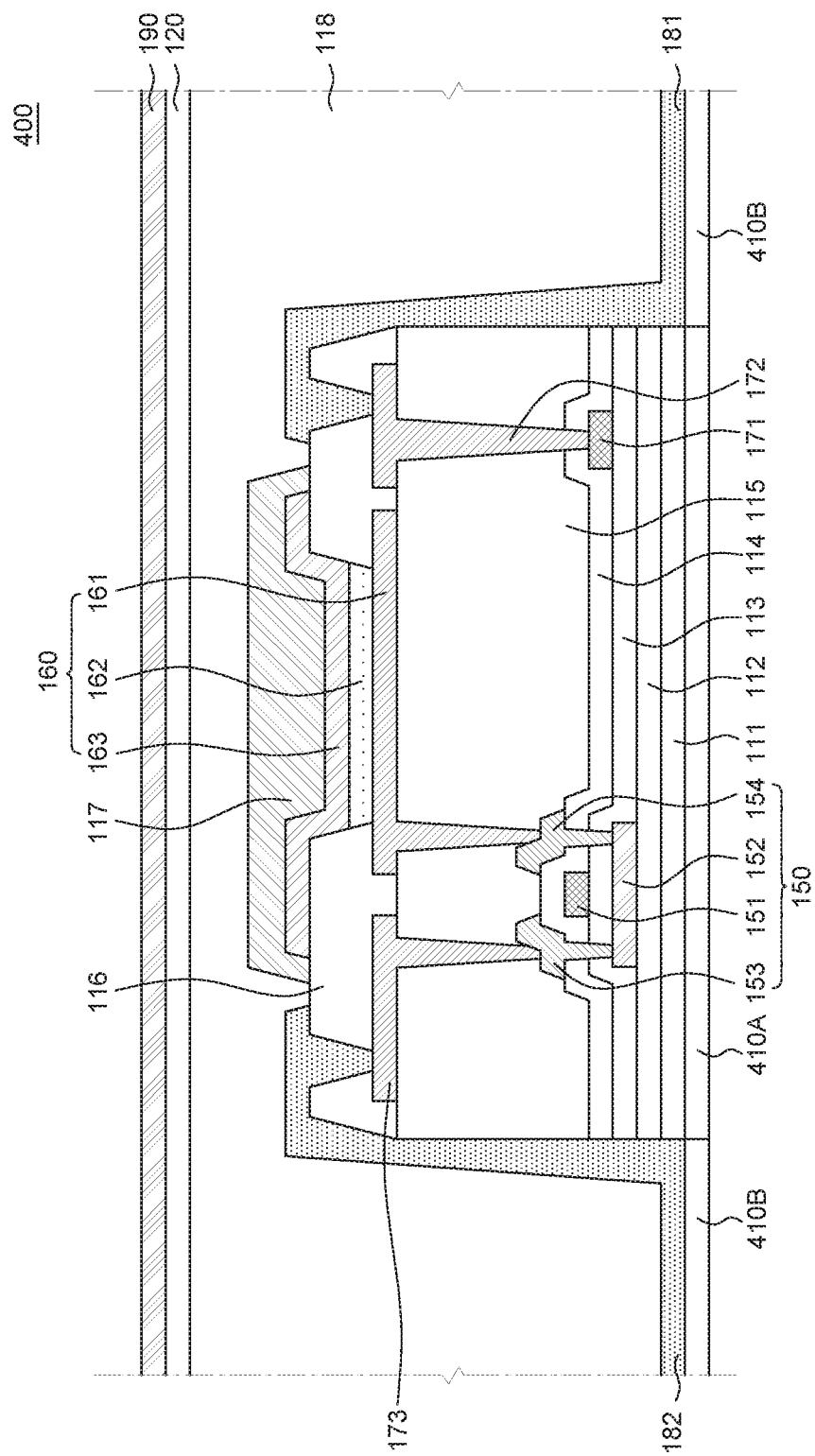
FIG. 4 is a cross-sectional view schematically showing one subpixel of a stretchable display device according to another embodiment of the present disclosure.

FIG. 4 is a cross-sectional view schematically showing one subpixel of a stretchable display device according to another embodiment of the present disclosure. A stretchable display device 400 shown in FIG. 4 is substantially the same as the stretchable display device 100 shown in FIGS. 1 to 3 except for having a different lower substrate 410, so repeated description is not provided.

Referring to FIG. 4, the lower substrate 410 includes a plurality of first lower areas 410A and second lower areas 410B. The plurality of first lower areas 410A are disposed in the areas overlapped with a plurality of individual substrates 111 on the lower substrate 410. The plurality of first lower areas 410A may be disposed under the individual substrates 111 with the top surfaces bonded to the bottoms surface of the plurality of individual substrates 111.

The second lower areas 410B are disposed in areas excepting the plurality of first lower areas 410A on the lower substrate 410. The second lower areas 410B may be disposed in the same plane as the plurality of first lower areas 410A while surrounding the plurality of first lower areas 410A. The second lower areas 410B are disposed under connecting lines 180 and an adhesive layer 118 with the top surfaces in contact with the bottoms surface of the connecting lines 180 and the bottom surface of the adhesive layer 118.

A modulus of elasticity of the plurality of first lower areas 410A may be higher than a modulus of elasticity of the second lower areas 410B. Accordingly, the plurality of first lower areas 410A may be a plurality of hard lower areas that are harder than the second lower areas 410B. The second lower areas 410B may be flexible lower areas that are more pliant than the plurality of first lower areas 410A. The modulus of elasticity of the plurality of first lower areas 410A may be a thousand times higher than those of the second lower areas 410B, but is not limited thereto.

The plurality of first lower areas 410A may be made of the same material as the plurality of individual substrates 111, may be made of a plastic material having flexibility, and for example, may be made of polyimide (PI), polyacrylate, polyacetate, or the like. However, the plurality of first lower areas 410A are not limited thereto and may be made of a material having a modulus of elasticity that is the same as or lower than those of the plurality of individual substrates 111.

The second lower areas 410B may be disposed in the same plane as the plurality of first lower areas 410A and may be disposed to surround the plurality of first lower areas 410A. The second lower areas 410B, which are flexible lower areas, can reversely expand and contract and may have an elastic modulus of several to hundreds of MPa and a tensile fracture rate of 100% or more. Accordingly, the second lower areas 410B may be made of a bendable or stretchable insulating material and may be made of silicon rubber such as polydimethylsiloxane (PDMS) or an elastomer such as polyurethane (PU), but are not limited thereto. The thickness of the second lower areas 410B may be 10 μm to 1 mm and the thickness of the first lower areas 410A may be 1 μm to 1 mm.

In the stretchable display device 400 according to another embodiment of the present disclosure, the lower substrate 410 includes the plurality of first lower areas 410A overlapped with the plurality of individual substrates 111 and the second lower areas 410B excepting the plurality of first lower areas 410A. Further, a modulus of elasticity of the plurality of first lower areas 410A is higher than a modulus of elasticity of the second lower areas 410B. When the stretchable display device 400 is deformed such as bending or stretching, the plurality of first lower areas 410A disposed under the plurality of individual substrates 111 that are hard substrates may support the plurality of individual substrates 111 as hard lower areas. Accordingly, various elements disposed on the plurality of individual substrates 111 may be supported together with the plurality of individual substrates 111 by the plurality of first lower areas 410A and damage to the elements due to deformation of the stretchable display device 400 can be reduced.

Further, when the stretchable display device 400 is deformed such as bending or stretching, the plurality of first lower areas 410A are made of the same material as the plurality of individual substrates 111 and have a modulus of elasticity higher than the second lower areas 410B. Accordingly, when the stretchable display device 400 is deformed such as bending or stretching, the plurality of first lower areas 410A may be stretched more than the plurality of individual substrates 111 without deformation, and the plurality of first lower areas 410A and the plurality of individual substrates 111 may keep firmly bonded to each other. Therefore, since the plurality of first lower areas 410A and the plurality of individual substrates 111 can keep firmly bonded to each other in the stretchable display device 400 according to another embodiment of the present disclosure, defect of the stretchable display device 400 can be reduced even if the stretchable display device 400 is continuously deformed such as bending or stretching.

Since the second lower areas 410B not overlapped with the plurality of individual substrates 111 are more pliant softer than the plurality of first lower areas 410A, the areas where the second lower areas 410B are disposed between the plurality of individual substrates 111 may be freely bent or stretched. Accordingly, the connecting lines 180 overlapped with the second lower areas 410B also may be freely bent or stretched. Therefore, the stretchable display device 400 according to another embodiment of the present disclosure can be more easily deformed such as bending or stretching. Although the modulus of elasticity of the individual substrates is higher than that of the lower substrate or the second lower areas of the lower substrate as described above, the present disclosure is not limited thereto. The modulus of elasticity of the individual substrates may be higher than that of at least one part of the lower substrate as required. For example, in the case of only a predetermined area of the stretchable display device is stretched or the stretchable display device is only stretched in a predetermined direction, the modulus of elasticity of the individual substrates may be configured to be higher than that of a part of the lower substrate corresponding to the predetermined area or the predetermined direction.

Further, the lower substrate 410, and the upper substrate 120 and the polarizing layer 190 disposed on the plurality of individual substrates 111 are formed in a single layer, respectively, in the stretchable display device 400 according to an embodiment of the present disclosure. Accordingly, it is possible to suppress in advance a problem with alignment that may be generated in the process of bonding the upper substrate 120 and the polarizing layer 190 to the lower substrate 410 and the plurality of individual substrates 111.

Upper Substrate Including Plurality of Hard Areas & Flexible Areas

Figure 5:
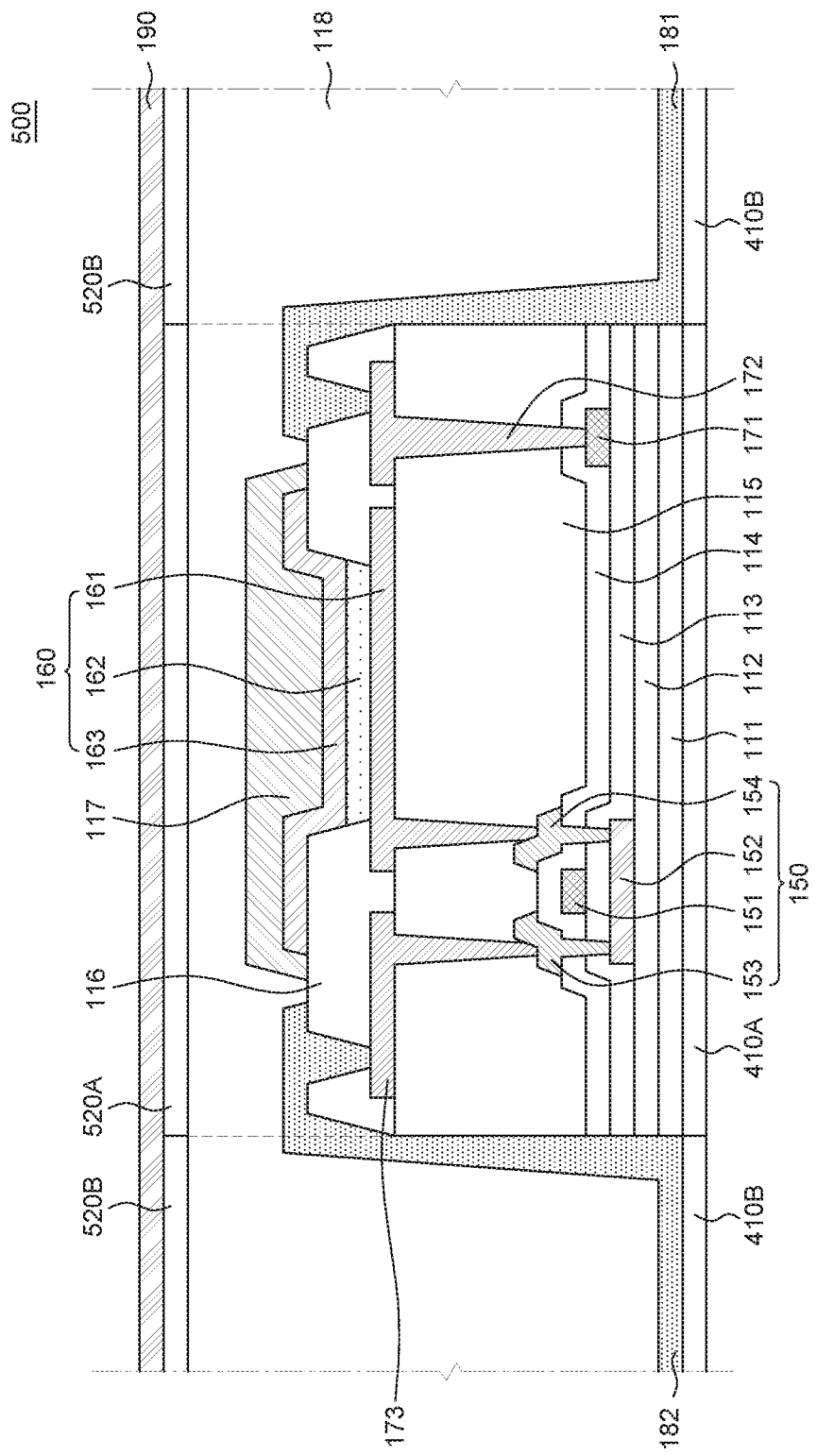
FIG. 5 is a cross-sectional view schematically showing one subpixel of a stretchable display device according to another embodiment of the present disclosure.

FIG. 5 is a cross-sectional view schematically showing one subpixel of a stretchable display device according to another embodiment of the present disclosure. A stretchable display device 500 shown in FIG. 5 is substantially the same as the stretchable display device 400 shown in FIG. 4 except for having a different upper substrate 520, so repeated description is not provided.

Referring to FIG. 5, the upper substrate 520 includes a plurality of first upper areas 520A and second upper areas 520B. The plurality of first upper 520A is disposed in areas overlapped with the plurality of first lower areas 410A on an upper substrate 520. The plurality of first upper areas 520A may be disposed by overlapping the plurality of first lower areas 410A on the elements of the plurality of individual substrates 111 to correspond to the plurality of first lower areas 410A and the plurality of individual substrates 111.

The second upper areas 520B are disposed in areas excepting the plurality of first upper areas 520A on the upper substrate 520. The second upper areas 520B may be disposed in the same plane as the plurality of first upper areas 520A and may be disposed by surrounding the plurality of first upper areas 520A to correspond to the second lower areas 410B.

A modulus of elasticity of the plurality of first upper areas 520A may be higher than a modulus of elasticity of the second upper areas 520B. Accordingly, the plurality of first upper areas 520A may be a plurality of hard upper areas that are harder than the second upper areas 520B. The second upper areas 520B may be flexible upper areas that are more pliant than the plurality of first upper areas 520A. The modulus of elasticity of the plurality of first upper areas 520A may be a thousand times higher than those of the second upper areas 520B, but are not limited thereto.

The plurality of first upper areas 520A, which are hard upper areas, may be made of the same material as the plurality of first lower areas 410A, may be made of a plastic material having flexibility, and for example, may be made of polyimide (PI), polyacrylate, polyacetate, or the like. However, they are not limited thereto. However, the plurality of first upper areas 520A are not limited thereto and may be made of a material having a modulus of elasticity that is the same as or lower than those of the plurality of individual substrates 111.

The second upper areas 520B, which are flexible upper areas, may be made of a bendable or stretchable insulating material. Accordingly, the second upper areas 520B can reversely expand and contract. The second upper areas 520B may have an elastic modulus of several to hundreds of MPa and a tensile fracture rate of 100% or more.

The second upper areas 520B may be made of the same material as the second lower areas 410B, for example, silicon rubber such as polydimethylsiloxane (PDMS) or an elastomer such as polyurethane (PU), so they can have flexibility, but are not limited thereto.

In the stretchable display device 500 according to another embodiment of the present disclosure, the upper substrate 520 includes the plurality of first upper areas 520A overlapped with the plurality of first lower areas 410A and the second upper areas 520B excepting the plurality of first upper areas 520A. Further, a modulus of elasticity of the plurality of first upper areas 520A are higher than a modulus of elasticity of the second upper areas 520B. When the stretchable display device 500 is deformed such as bending or stretching, various elements disposed on the plurality of individual substrates 111 may be protected by the plurality of first upper areas 520A. The plurality of first upper areas 520A are hard areas and have a hard characteristic. Accordingly, even though the stretchable display device 500 is deformed such as bending or stretching, damage to the elements disposed in the areas overlapped with the plurality of first upper areas 520A may be reduced by the plurality of first upper areas 520A that are hard areas.

The second upper areas 520B not overlapped with the plurality of individual substrates 111 are more pliant than the plurality of first upper areas 520A, so the areas where the second upper areas 520B are disposed between the plurality of individual substrates 111 may be freely bent or stretched. Accordingly, connecting lines 180 being disposed by overlapping the second upper areas 520B also may be more freely moved. Therefore, the stretchable display device 500 according to another embodiment of the present disclosure can be more easily deformed such as bending or stretching.

Polarizing Layer Including Plurality of Polarizing Areas and Flexible Areas

Figure 6:
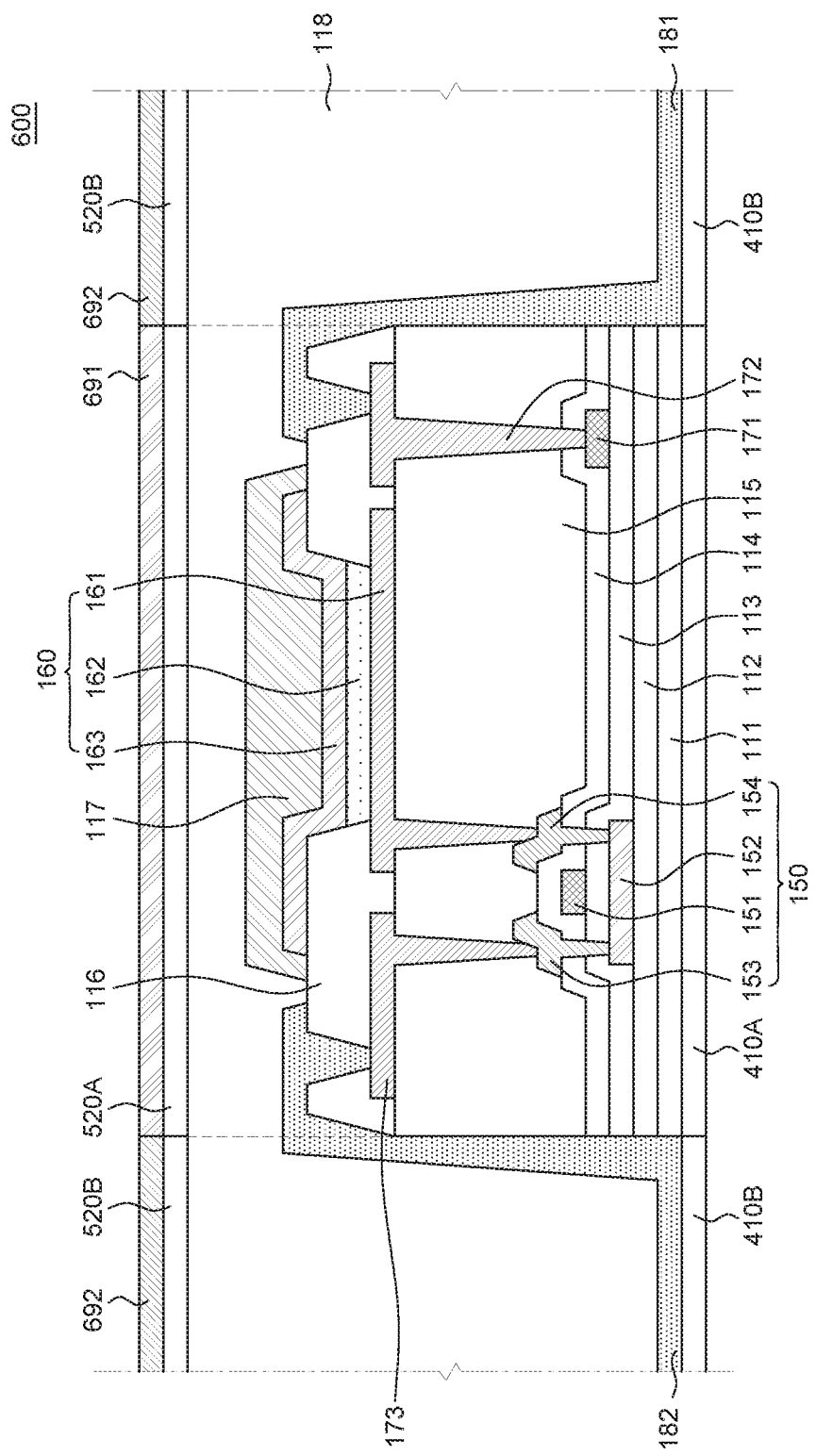
FIG. 6 is a cross-sectional view schematically showing one subpixel of a stretchable display device according to another embodiment of the present disclosure.

FIG. 6 is a cross-sectional view schematically showing one subpixel of a stretchable display device according to another embodiment of the present disclosure. A stretchable display device 600 shown in FIG. 6 is substantially the same as the stretchable display device 500 shown in FIG. 5 except for having a different polarizing layer 690, so repeated description is not provided.

Referring to FIG. 6, the polarizing layer 690 includes a plurality of polarizing areas 691 and flexible areas 692. The plurality of polarizing areas 691 are disposed in areas overlapped with a plurality of first lower areas 410A on the polarizing layer 690. That is, the plurality of polarizing areas 691 may overlap a plurality of first lower areas 410A, a plurality of individual substrates 111, and a plurality of first upper substrates 520A.

The plurality of polarizing areas 691 of the polarizing layer 690 is a component that polarizes light incident into the stretchable display device 600 from the outside. The plurality of polarizing areas 691 may overlap the plurality of first lower areas 410A and then, may overlap the plurality of individual substrates 111. Further, the plurality of polarizing areas 691 may overlap the plurality of first upper areas 520A. Accordingly, the plurality of polarizing areas 691 may overlap organic light emitting elements 160 disposed on the plurality of individual substrates 111.

Light incident from the top surface of the plurality of polarizing areas 691 to the bottom surface of the plurality of polarizing areas 691 and then polarized through the polarizing areas 691 may be reflected in the stretchable display device 600, so the phase of the light may be changed. The light having the changed phase may not pass through the plurality of polarizing areas 691. Accordingly, light incident in the stretchable display device 600 through the plurality of polarizing areas 691 from the outside of the stretchable display device 600 is not discharged back to the outside of the stretchable display device 600, so the external light reflection of the stretchable display device 600 may be reduced.

The flexible areas 692 are disposed in areas overlapped with second lower areas 410B on the polarizing layer 690. The flexible areas 692 of the polarizing layer 690 are areas disposed in the same plane as the plurality of polarizing areas 691 and having flexibility. The flexible areas 692 are disposed in the same plane as the plurality of polarizing areas 691 while surrounding the plurality of polarizing areas 691.

A modulus of elasticity of the flexible areas 692 may be lower than a modulus of elasticity of the plurality of polarizing areas 691. The plurality of polarizing areas 691 may be harder than the flexible areas 692 and the flexible areas 692 may be pliant than the plurality of polarizing areas 691.

The modulus of elasticity of the flexible areas 692 may be the same as that of the second lower areas 410B. The second lower areas 410B are flexible lower areas and the flexible areas 692 of the polarizing layer 690 may be areas having the same modulus of elasticity as the second lower areas 410B. Accordingly, the flexible areas 692 can reversely expand and contract and may have an elastic modulus of several to hundreds of MPa and a tensile fracture rate of 100% or more. The flexible areas 692 may be made of a bendable or stretchable insulating material. The flexible areas 692 may be made of the same material as the second lower areas 410B, for example, silicon rubber such as polydimethylsiloxane (PDMS) or an elastomer such as polyurethane (PU), but are not limited thereto.

The flexible areas 692 may be the same in transmittance as the plurality of polarizing areas 691. In detail, the flexible areas 692 may include dye, so the flexible areas 692 may be the same in transmittance as the plurality of polarizing areas 691. The dye may be black dye or carbon black. For example, since common polarizing layers have transmittance of 40 to 45%, when the plurality of polarizing areas 691 have transmittance of 40 to 45%, the flexible areas 692 also may have transmittance of 40 to 45%, but are not limited thereto. In this specification, the fact that transmittance is the same may include not only that transmittance is completely the same, but also that people cannot feel a difference when they look at the display device from the outside even if there is some difference in transmittance.

In the stretchable display device 600 according to another embodiment of the present disclosure, the polarizing layer 690 includes the plurality of polarizing areas 691 overlapped with the plurality of individual substrates 111 and the flexible areas 692 excepting the plurality of polarizing areas 691. Accordingly, since the plurality of polarizing areas 691 are disposed on the individual substrates 111 having the organic light emitting elements 160 thereon, external light reflection can be suppressed. Further, the area overlapped with the flexible areas 692 excepting the plurality of polarizing areas 691 can be freely bent or stretched. Thus, since the flexible areas 692 have flexibility, the connecting lines 180 overlapped with the flexible areas 692 can be more freely deformed when the stretchable display device 600 is deformed such as bending or stretching. Therefore, the flexibility of the stretchable display device 600 can be improved.

Further, since the plurality of polarizing areas 691 and the flexible areas 692 have the same transmittance in the stretchable display device 600 according to an embodiment of the present disclosure, the transmittance of the areas where the plurality of polarizing areas 691 are disposed and the areas where the plurality of polarizing areas 691 are not disposed can be maintained the same. The areas where the flexible areas 692 are disposed do not overlap the organic light emitting elements 160 disposed on the plurality of individual substrates 111, so external light reflection may not matter even if the plurality of polarizing areas 691 are not disposed. However, when there is a difference in transmittance between the areas where the plurality of polarizing areas 691 are disposed and the areas where the flexible areas 692 are disposed, a user can visually recognize the areas, so the display quality may be deteriorated. Accordingly, since the flexible areas 692 have the same transmittance as the plurality of polarizing areas 691 by including dye etc., in the stretchable display device 600 according to another embodiment of the present disclosure, it is possible to improve the display quality of the stretchable display device 600 according to another embodiment of the present disclosure and it is also possible to make the entire transmittance of the active area AA uniform. It is also possible to minimize external light reflection that may be generated by the connecting lines 180 disposed under the flexible areas 692.

Although the polarizing layer 690 includes the plurality of polarizing areas 691 and the flexible areas 692 in FIG. 6, the present disclosure is not limited thereto and the polarizing layer 690 may include only the plurality of polarizing areas 691 and the flexible areas 692 may be separate from the polarizing layer 690.

Adhesive Area Having Same Transmittance as Polarizing Area

Figure 7:
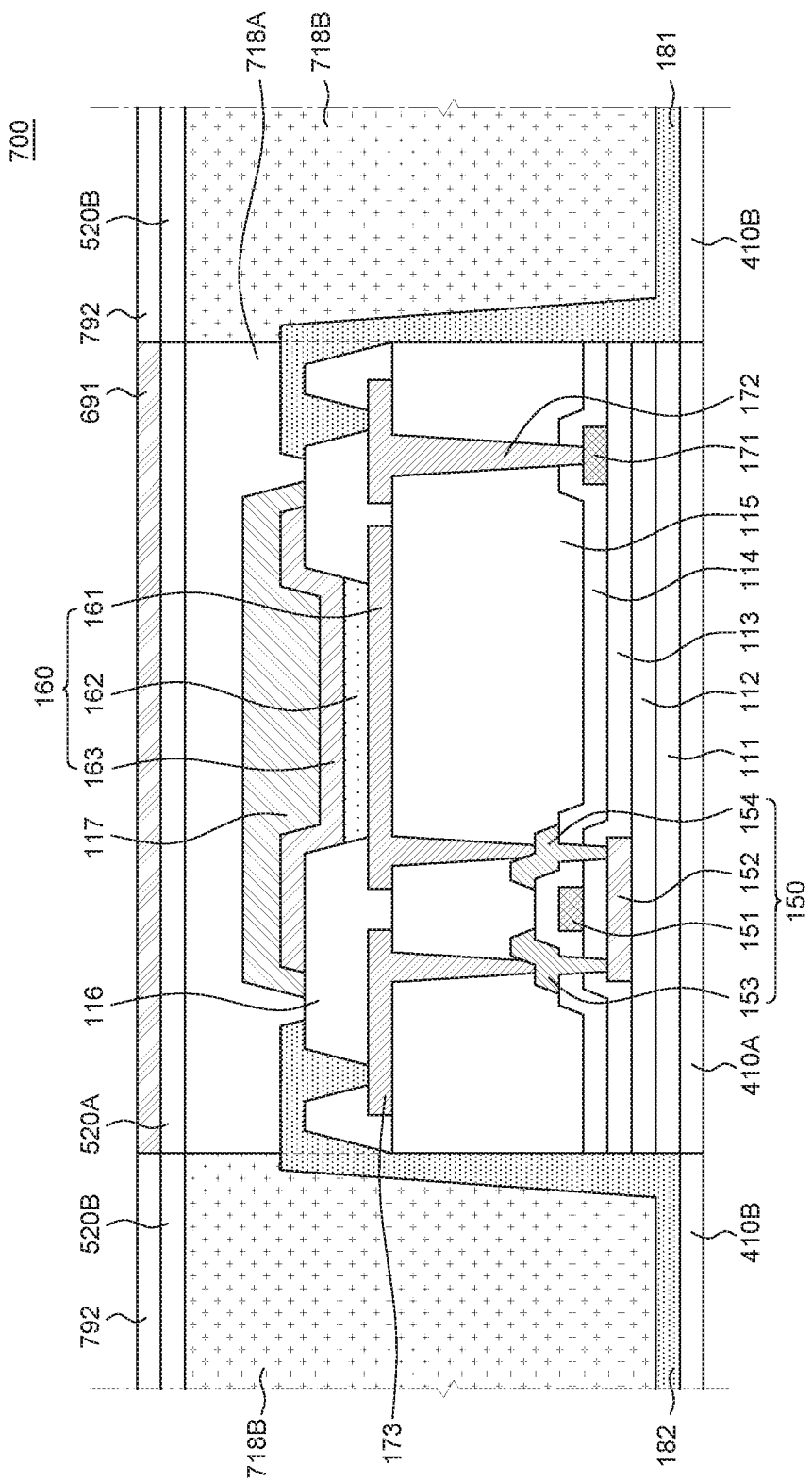
FIG. 7 is a cross-sectional view schematically showing one subpixel of a stretchable display device according to another embodiment of the present disclosure.

FIG. 7 is a cross-sectional view schematically showing one subpixel of a stretchable display device according to another embodiment of the present disclosure. A stretchable display device 700 shown in FIG. 7 is substantially the same as the stretchable display device 600 shown in FIG. 6 except for having different polarizing layer 790 and adhesive layer 718, so repeated description is not provided.

Referring to FIG. 7, the polarizing layer 790 of the stretchable display device 700 includes a plurality of polarizing areas 691 and flexible areas 792. The plurality of polarizing areas 691 are substantially the same as the plurality of polarizing areas 691 described with reference to FIG. 6, so they are not repeatedly described herein.

A modulus of elasticity of the flexible areas 792 of the stretchable display device 700 may be the same as a modulus of elasticity of the second lower areas 410B and may have an elastic modulus of several to hundreds of MPa and a tensile fracture ratio of 100% or more. The flexible areas 792 may be made of a bendable or stretchable insulating material. The flexible areas 792 may be made of the same material as the second lower areas 410B, for example, silicon rubber such as polydimethylsiloxane (PDMS) or an elastomer such as polyurethane (PU), but are not limited thereto.

The flexible areas 792 of the stretchable display device 700 are different in transmittance from the plurality of polarizing areas 691. In detail, the flexible areas 792 are made of a transparent material without dye, so light incident into one surface of the flexible areas 792 can be intactly discharged through the other surface. Accordingly, light incident into the flexible areas 792 from the top surface of the polarizing layer 790 may be intactly incident to the bottom surface of the flexible areas 792.

Referring to FIG. 7, the adhesive layer 718 of the stretchable display device 700 includes a plurality of first adhesive areas 718A and second adhesive areas 718B. The plurality of first adhesive areas 718A of the adhesive layer 718 are disposed in areas overlapped with the plurality of individual substrates 111 of the adhesive layer 718. The plurality of first adhesive areas 718A overlap the plurality of first upper areas 520A and the plurality of first lower areas 410A. The plurality of first adhesive areas 718A are disposed on the banks 116, the encapsulation layers 117, and the connecting lines 180. The plurality of first adhesive areas 718A are disposed under the plurality of first upper areas 520A with the top surfaces in contact with the bottoms surface of the plurality of first upper areas 520A.

The second adhesive areas 718B of the adhesive layer 718 are disposed in areas excepting the plurality of first adhesive areas 718A of the adhesive layer 718. The second adhesive areas 718B overlap the second upper areas 520B, the second lower areas 410B, and the flexible areas 792 while surrounding the plurality of first adhesive areas 718A.

The second adhesive areas 718B of the adhesive layer 718 may be the same in transmittance as the plurality of polarizing areas 691. The second adhesive areas 718B may include dye etc., so the second adhesive areas may be the same in transmittance as the plurality of polarizing areas 691.

In the stretchable display device 700 according to another embodiment of the present disclosure, the polarizing layer 790 may include the plurality of polarizing areas 691 overlapped with the plurality of individual substrates 111 and the flexible areas 792 excepting the plurality of polarizing areas 691. The adhesive layer 718 may include the plurality of first adhesive areas 718A and the second adhesive areas 718B and the second adhesive areas 718B may be the same in transmittance as the plurality of polarizing areas 691. Accordingly, since the plurality of polarizing areas 691 are disposed on the plurality of individual substrates 111 having the organic light emitting elements 160 thereon, external light reflection can be suppressed. Further, the areas overlapped with the flexible areas 792 excepting the plurality of polarizing areas 691 can be freely bent or stretched.

Further, since the plurality of polarizing areas 691 and the second adhesive areas 718B have the same transmittance in the stretchable display device 700 according to another embodiment of the present disclosure, the transmittance of the areas where the plurality of polarizing areas 691 are disposed and the areas where the plurality of polarizing areas 691 are not disposed can be maintained the same. The areas where the second adhesive areas 718B are disposed do not overlap the organic light emitting elements 160 disposed on the plurality of individual substrates 111, so external light reflection may not matter even if the plurality of polarizing areas 691 are not disposed. However, when there is a difference in transmittance between the areas where the plurality of polarizing areas 691 are disposed and the areas where the second adhesive areas 718B are disposed, a user can visually recognize the areas, so the display quality may be deteriorated. Accordingly, since the second adhesive areas 718B have the same transmittance as the plurality of polarizing areas 691 by including dye etc., in the stretchable display device 700 according to another embodiment of the present disclosure, it is possible to improve the display quality of the stretchable display device 700 according to another embodiment of the present disclosure and it is also possible to make the entire transmittance of the active area AA uniform. It is also possible to minimize external light reflection that may be generated by the connecting lines 180 disposed under the second adhesive areas 718B.

Low-Potential Voltage Line Surrounding Edge

Figure 8A:
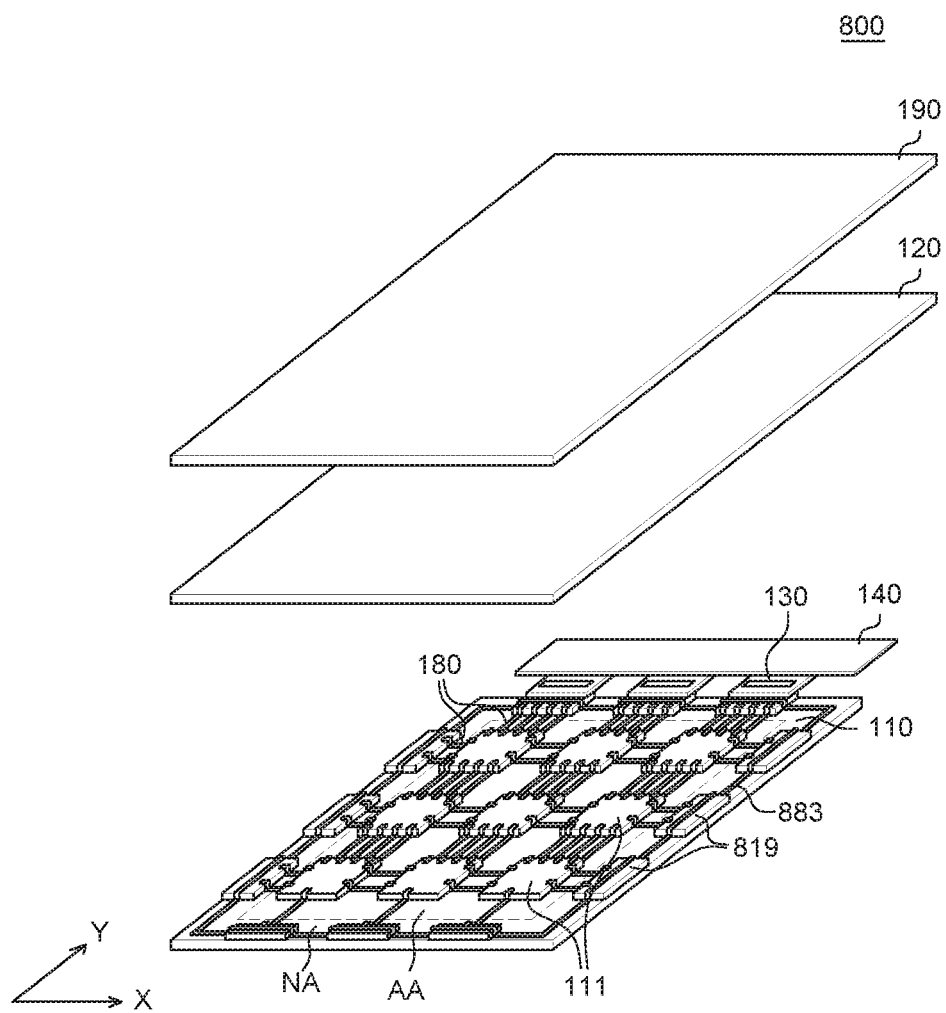
FIG. 8A is an exploded perspective view of a stretchable display device according to another embodiment of the present disclosure.
Figure 8B:
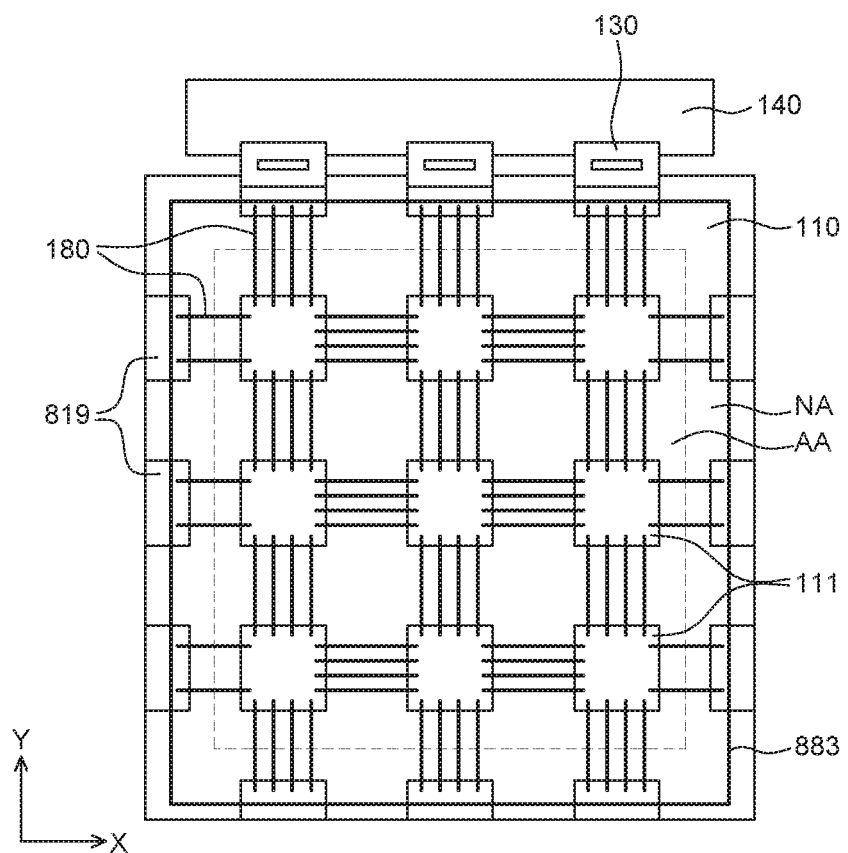
FIG. 8B is a plan view of the stretchable display device according to another embodiment of the present disclosure.

FIG. 8A is an exploded perspective view of a stretchable display device according to another embodiment of the present disclosure. FIG. 8B is a plan view of the stretchable display device according to another embodiment of the present disclosure. FIG. 8B is a plan view showing the stretchable display device 800 shown in FIG. 8A with an upper substrate 120 and a polarizing layer 190 removed. A stretchable display device 800 shown in FIGS. 8A and 8B is substantially the same as the stretchable display device 100 shown in FIGS. 1 to 3 except that additional individual substrates 819 and a low-potential voltage line 883 are added, so repeated description is not provided.

Referring to FIGS. 8A and 8B, a plurality of additional individual substrates 819 is disposed along the edge of a lower substrate 110. The plurality of additional individual substrates 819 mean substrates disposed in a non-active area NA surrounding an active area AA where the plurality of individual substrates 111 are disposed.

The plurality of additional individual substrates 819, which are hard substrates, are spaced apart from each other on the lower substrate 110 and disposed around the edge of the lower substrate 110. The plurality of additional individual substrates 819 may be harder than the lower substrate 1110 and may have a harder characteristic than the lower substrate 110.

The plurality of additional individual substrates 819 may be made of the same material as the plurality of individual substrates 111, may be made of a plastic material having flexibility and, for example, may be made of polyimide (PI), polyacrylate, or polyacetate. However, the plurality of additional individual substrates 819 are not limited thereto.

The modulus of elasticity of the plurality of additional individual substrates 819 may be higher than that of the lower substrate 110. Accordingly, the plurality of additional individual substrates 819 may be a plurality of additional hard substrates that are harder than the lower substrate 110. The modulus of elasticity of the plurality of additional individual substrates 819 may be a thousand times higher than that of the lower substrate 110, but is not limited thereto.

A gate driving unit may be directly disposed on the plurality of additional individual substrates 819, unlike the COFs 130 shown in FIG. 1. The gate driving units can transmit signals to organic light emitting elements 160 disposed on the plurality of individual substrates 111 on the active area.

A low-potential voltage line 883 is disposed around the edge of the lower substrate 110. The low-potential voltage line 883 is a line that transmits a low-potential voltage to the organic light emitting elements 160 disposed on the plurality of individual substrates 111. The low-potential voltage line 883 is disposed on the plurality of additional individual substrates 819 on the lower substrate 110 and disposed around the edge of the lower substrate 110. In detail, the low-potential voltage line 883 is disposed on the plurality of additional individual substrates 819 disposed around the edge of the lower substrate 110 and on the lower substrate 110 between adjacent additional individual substrates 819 around the edge of the lower substrate 110.

Between the outermost individual substrates 111 adjacent to the plurality of additional individual substrates 819 and the plurality of additional individual substrates 819, connecting lines 180 connecting organic light emitting elements 160 on the plurality of individual substrates 111 and low-potential voltage lines 883 are disposed. The connecting lines 180 extend to the top surface of the lower substrate 110 between the plurality of individual substrates 111 and the plurality of additional individual substrates 819 on the plurality of individual substrates 111, thereby extending on the plurality of additional individual substrates 819. Accordingly, the connecting lines 180 can transmit a low-potential voltage from the low-potential voltage lines 883 and can transmit also a gate voltage from the gate driving units.

The stretchable display device 800 according to another embodiment of the present disclosure includes the plurality of additional individual substrates 819 disposed around the edge of the lower substrate 110 and having driving units, and the low-potential voltage lines 883 disposed on the lower substrate 110 and the additional individual substrate 819 to surround the edge of the lower substrate 110 and supplying a low-potential voltage to a plurality of pixels, respectively. As described above, in the stretchable display device 800, cathodes are formed, patterned and disposed respectively for the plurality of individual substrates 111 and are not disposed in the areas between the plurality of individual substrates 111. Accordingly, it is possible to supply a low-potential voltage to the active area AA from four sides of the active area AA through the low-potential voltage lines 883 and the connecting line in the stretchable display device 800 according to another embodiment of the present disclosure.

Connecting Line Made of Conductive Component and Having Curved Shape

Figure 9:
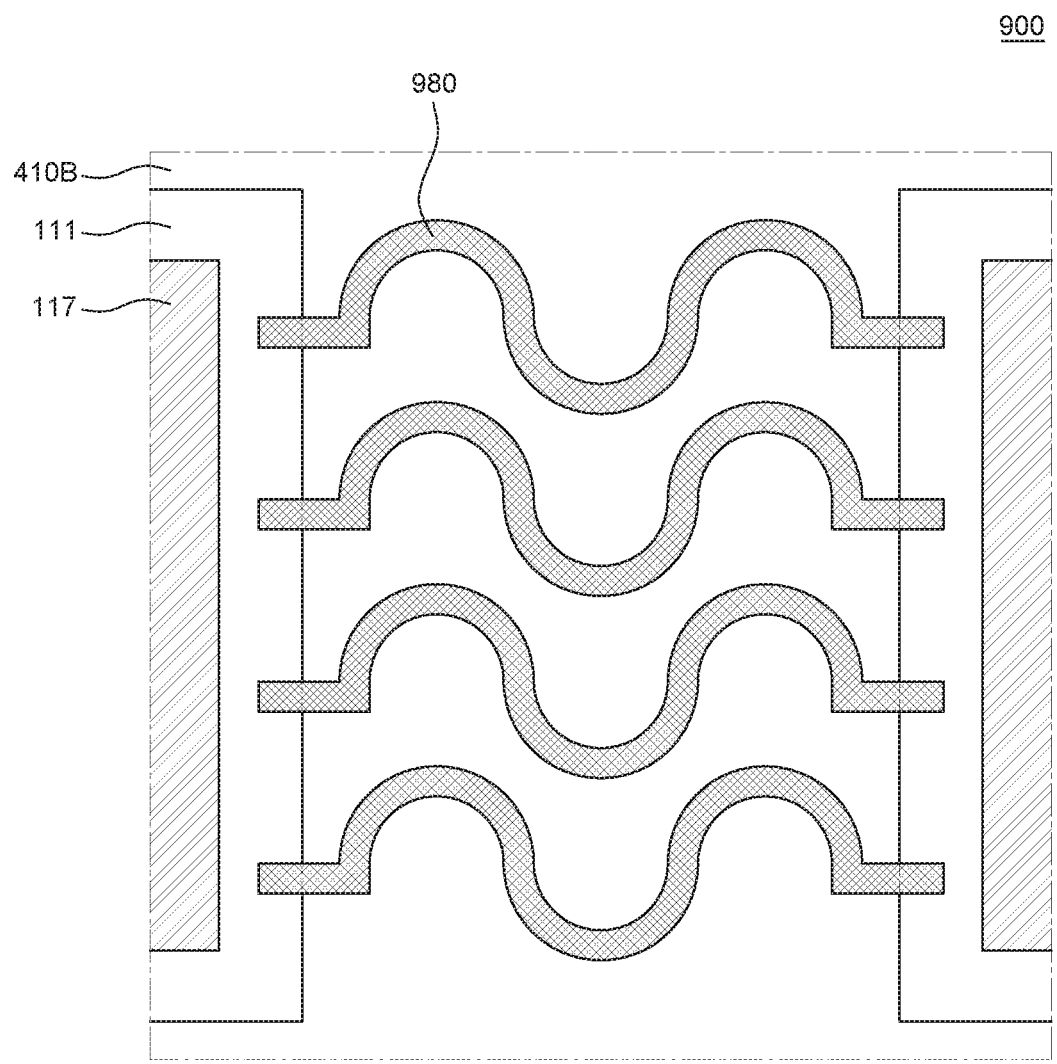
FIG. 9 is an enlarged plan view of the stretchable display device according to another embodiment of the present disclosure.
Figure 10:
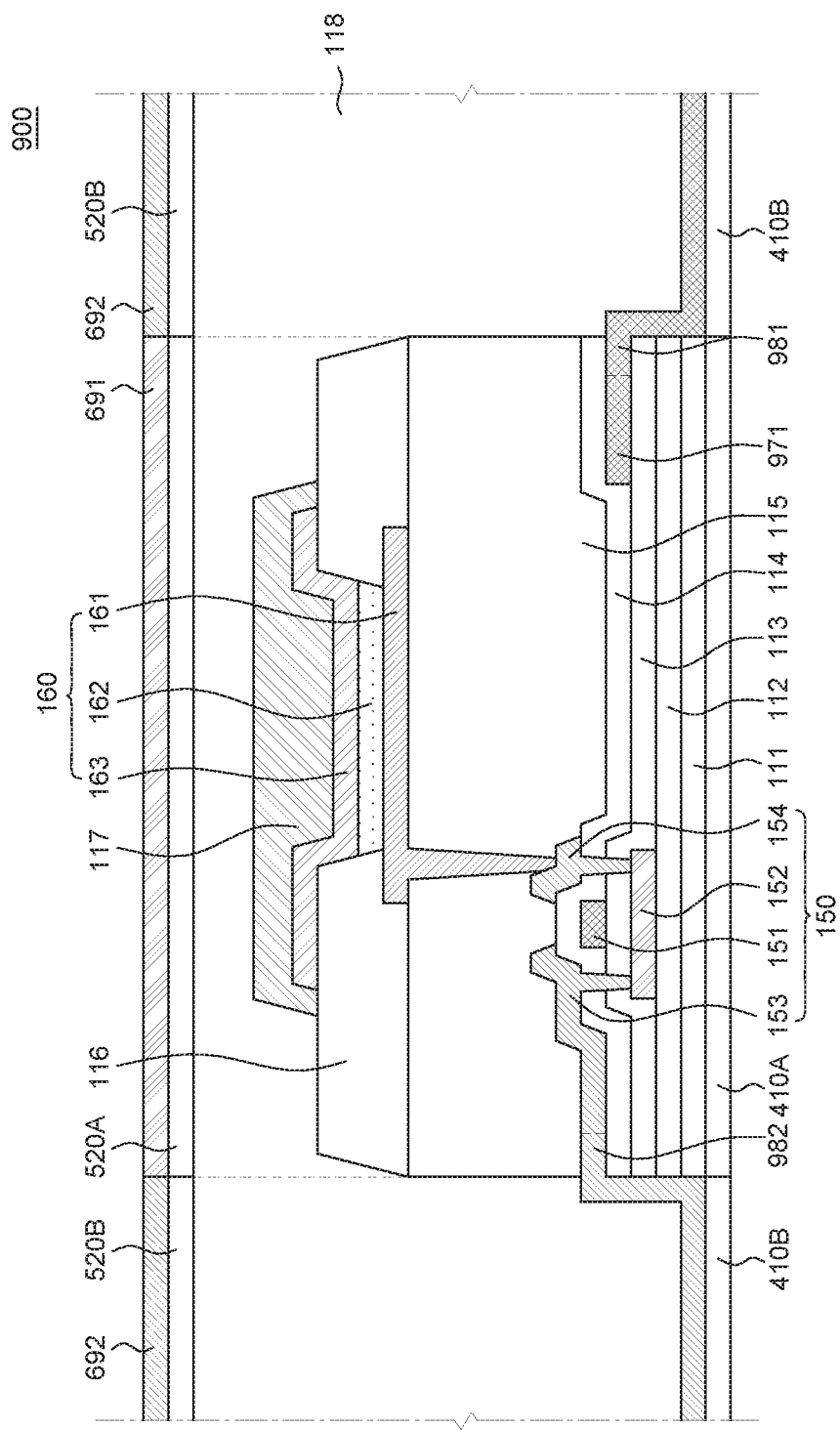
FIG. 10 is a cross-sectional view schematically showing one subpixel of the stretchable display device shown in FIG. 9.

FIG. 9 is an enlarged plan view of the stretchable display device according to another embodiment of the present disclosure. FIG. 10 is a cross-sectional view schematically showing one subpixel of the stretchable display device shown in FIG. 9. A stretchable display device 900 shown in FIGS. 9 and 10 is substantially the same as the stretchable display device 600 shown in FIG. 6 except for having different connecting lines 980, so repeated description is not provided. Only encapsulation layers 117 of various components disposed on individual substrates 111, and connecting lines 980 are shown in FIG. 9 for the convenience of description.

Referring to FIG. 9, the connecting lines 980 of a stretchable display device 900 have a curved shape, for example, a curved shape means wave shape or a diamond shape. The connecting lines 980 electrically connect the pads disposed on adjacent individual substrates 111 of a plurality of individual substrates 111 and extend not in a straight line, but in a curved shape between the pads. For example, as shown in FIG. 9, the connecting lines 980 may have a sine waveform. However, the shape of the connecting lines 980 is not limited to this shape and may have various shapes. For example, the connecting lines 980 may extend in a zigzag shape, a chevron shape, a simple wave shape or a plurality of diamond-shaped connecting lines extend with the apexes connected.

Referring to FIG. 10, a gate pad 971 is formed on a gate insulating layer 113 and a first connecting line 981 is formed on the gate insulating layer 113 and the second lower areas 410B of the lower substrate 410.

Referring to FIG. 10, the first connecting line 981 that can function as a gate line is connected with the gate pad 971 and extends from the top surface of the gate insulating layer 113 to the top surface of the second lower area 410B. Accordingly, the first connecting lines 981 can electrically connect the gate pads 971 respectively formed on adjacent individual substrates 111. The first connecting line 981 is in contact with the second lower areas 410B between the plurality of individual substrates 111.

The first connecting line 981 and the gate pad 971 may be made of the same material as a gate electrode 151. Accordingly, the first connecting line 981 and the gate pad 971 may be simultaneously formed in the same process as the gate electrode 151. Accordingly, the first connecting line 981 may be integrally formed to extend from the gate pad 971 However, the present disclosure is not limited thereto, and the gate pad 971 and the first connecting line 981 may be made of different materials, and may be disposed on different layers and electrically connected.

Referring to FIG. 10, a second connecting line 982 that can function as a data line is formed on an inter-layer insulating layer 114. A source electrode 153 may extend outside an individual substrate 111, may function as a data pad, and may be electrically connected with the second connecting line 982. However, the present disclosure is not limited thereto and a separate data pad may extend from the source electrode 153 or may be electrically connected with the source electrode 153.

The second connecting line 982 is connected with the source electrode 153 and extends from the top surface of an adjacent individual substrate 111 to the second lower area 410B. Accordingly, the second connecting line 982 can electrically connect the data pads formed on adjacent individual substrates 111. The second connecting line 982 is in contact with the second lower area 410B between the plurality of individual substrates 111.

The second connecting line 982 may be made of the same material as a data pad, that is, the source electrode 153. Accordingly, the second connecting line 982, the source electrode 153, and the drain electrode 154 may be simultaneously formed in the same process. Accordingly, the second connecting line 982 may be integrally formed to extend from the source electrode 153. However, the present disclosure is not limited thereto, and the second connecting line 982 and the source electrode 153 may be made of different materials, and may be disposed on different layers and electrically connected.

In the stretchable display device 900 according to another embodiment of the present disclosure, connecting lines 980 electrically connecting pads formed on the plurality of individual substrates 111, such as the first connecting line 981 and the second connecting line 982, may be made of the same material as at least one of a plurality of conductive components disposed on the plurality of individual substrates 111. For example, the first connecting line 981 may be made of the same material as the gate electrode 151 and the second connecting line 982 may be made of the same material as the source electrode 153. However, the present disclosure is not limited thereto and the connecting lines 980 may be made of the same materials as, other than the gate electrode 151 and the source electrode 153, a drain electrode 154, the electrode of an organic light emitting element 160 such as an anode 161 and a cathode 163 of the organic light emitting element 160, or various lines included in the stretchable display device 900. Accordingly, the connecting lines 980 can be simultaneously formed in the manufacturing process of conductive components made of the same material as the connecting lines 980 and disposed on the plurality of individual substrates 111 in the stretchable display device 900 according to another embodiment of the present disclosure. Therefore, there may not be a need for a separate manufacturing process for forming the connecting line 980.

A conductive reinforcing member may be disposed under or on a predetermined area of the connecting lines 980 shown in FIGS. 9 and 10. The conductive reinforcing member is a component that suppresses damage or cutting of a connecting line when the stretchable display device 900 is repeatedly stretched, and comes in contact with a connecting line to help transmit an electrical signal even if the connecting line is cut.

The conductive reinforcing member may be a base polymer or a conductive polymer including conductive particles uniformly distributed in a base polymer. As a base polymer has an easily extending property, the conductive reinforcing member may have flexibility.

The base polymer is a base layer in which conductive particles can be distributed, and may include Styrene Butadiene Styrene (SBS), but is not limited thereto. The conductive particles, which are particles having conductivity, may include at least one of silver (Ag), gold (Au), and carbon.

The conductive reinforcing member may be disposed under or on the connecting lines 980, adjacent to sides of the plurality of individual substrates 111. For example, the conductive reinforcing member may be in contact with the bottom surface of the connecting lines 980 and sides of the individual substrates 111, or may be in contact with the top surface of the connecting lines 980 and may be disposed adjacent to the sides of the individual substrates 111.

A step may exist between the connecting line 980 disposed on the plurality of individual substrates 111 and the connecting line 980 disposed on the lower substrate 110 due to the thickness of various components disposed on the plurality of individual substrates 111. It is possible to minimize damage that may be applied to the connecting lines 980 by disposing a conductive reinforcing member including a base polymer having flexibility under or on the connecting lines 980 to be in contact with or adjacent to sides of the plurality of individual substrates 111.

When a conductive reinforcing member is disposed between the connecting lines 980 and the lower substrate 110, the adhesive force between the connecting lines 980 and the lower substrate 110 can be increased and separation of the connecting lines 980 from the lower substrate 110 can be suppressed.

When a conductive reinforcing member is disposed on the connecting lines 980, the conductive reinforcing member may be formed on the connecting lines 980 before the upper substrate 520 and a polarizing layer 990 are bonded by the adhesive layer 118 after all the connecting lines 980 and various components on the plurality of individual substrates 111 are formed. Accordingly, the conductive reinforcing member can be more easily manufactured, and the manufacturing time or costs can be minimized.

The conductive reinforcing member may include liquid metal. The liquid metal means metal existing in a liquid state at room temperature. For example, the liquid metal may include at least one of gallium, indium, natrium, lithium, and an alloy thereof, but is not limited thereto. When a crack is generated in the connecting lines 980, the liquid metal can fill the crack of the connecting line 980. Accordingly, since the conductive reinforcing member includes liquid metal, when the stretchable display device 900 is deformed such as bending or stretching and a crack is generated in the connecting lines 980, the crack is filled with the liquid metal, so disconnection of the connecting lines 980 can be minimized. Further, the liquid metal has conductivity, so the entire resistance in the connecting lines 980 and the liquid metal can be reduced. Accordingly, electrical signals can be more smoothly transmitted between the pads on the plurality of individual substrates 111.

The conductive reinforcing member may also be disposed in a peak area of the connecting lines 980. The peak area of the connecting line 980 means an area where the amplitude of the curved connecting lines 980 is largest. For example, when the connecting lines 980 have a sine waveform, the point where the amplitude of the connecting lines 980 is largest may be defined as a peak area. When the stretchable display device 900 is deformed such as bending or stretching, stress can concentrate on the peak area of the connecting lines 980, as compared with other areas of the connecting lines 980.

In this case, the conductive reinforcing member may be disposed at the inner edge of the peak area of the connecting lines 980. The inner edge of the peak area of the connecting lines 980 may mean an area where a radius of curvature is relatively small in the peak area of the connecting lines 980 and the outer edge of the peak area may mean an area where the radius of curvature is relatively large in the peak area of the connecting lines 980. The conductive reinforcing member may be disposed under or on the connecting lines 980 at the inner edge of the peak area of the connecting lines 980.

When the stretchable display device 900 is deformed such as bending or stretching, damage such as a crack or disconnection may be easily generated in the peak area of the connecting lines 980, particularly, at the inner edge of the peak area in comparison to other areas. Even if damage is generated in the peak area of the connecting lines 980 or at the inner edge of the peak area, the conductive reinforcing member can suppress blocking of an electrical signal, so transmission of electrical signals in the stretchable display device 900 can be stably performed.

Stretchable Display Device Including Micro LED

Figure 11:
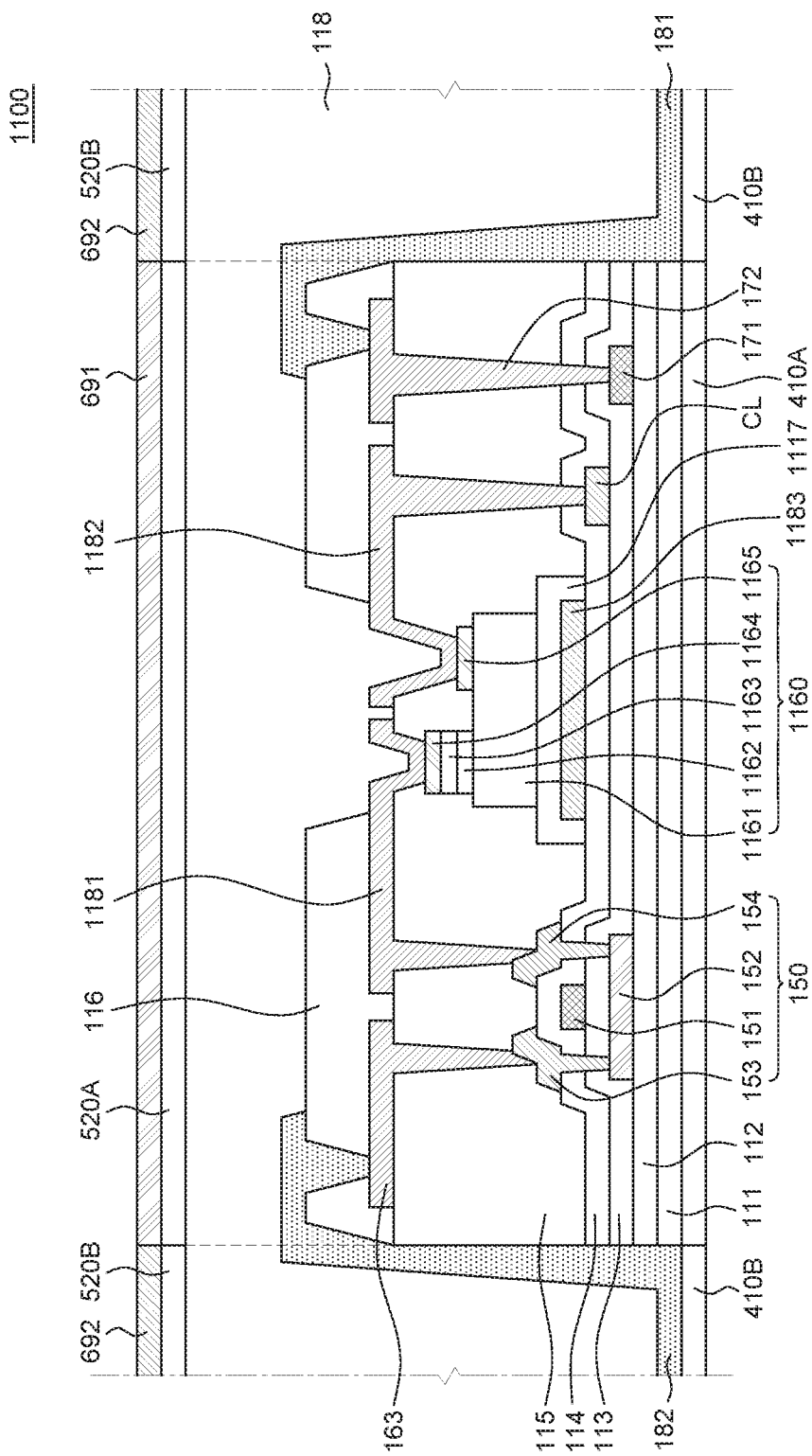
FIG. 11 is a cross-sectional view schematically showing one subpixel of a stretchable display device according to another embodiment of the present disclosure.

FIG. 11 is a cross-sectional view schematically showing one subpixel of a stretchable display device according to another embodiment of the present disclosure. A stretchable display device shown in FIG. 11 is substantially the same as the stretchable display device 600 shown in FIG. 6 except for including an LED 1160, so repeated description is not provided.

Referring to FIG. 11, a common line CL is disposed on the gate insulating layer 113. The common line CL is a line for applying a common voltage to a plurality of subpixels SPX. The common line CL may be made of the same material as the source electrode 153 and the drain electrode 154 of the transistor 150, but is not limited thereto.

A reflective layer 1183 is disposed on the inter-layer insulating layer 114. The reflective layer 1183 is a layer for discharging light emitted to the lower substrate 410 of light emitting from the LED 1160 to the outside by reflecting the light upward a stretchable display device 1100. The reflective layer 1183 may be made of a metal material having high reflectance.

An adhesive layer 1117 is disposed on the reflective layer 1183 to cover the reflective layer 1183. The adhesive layer 1117, which is a layer for bonding the LED 1160 on the reflective layer 1183, may insulate the reflective layer 1183 made of a metal material and the LED 1160. The adhesive layer 1117 may be made of a thermosetting material or a photocuring material, but is not limited thereto. Although the adhesive layer 1117 covers only the reflective layer 1183 in FIG. 11, the position of the adhesive layer 1117 is not limited thereto.

The LED 1160 is disposed on the adhesive layer 1117. The LED 1160 overlaps the reflective layer 1183. The LED 1160 includes an n-type layer 1161, an active layer 1162, a p-type layer 1163, an n-electrode 1165, and a p-electrode 1164. The LED 1160 is described as a lateral LED 1160 hereafter, but the structure of the LED 1160 is not limited thereto.

In detail, the n-type layer 1161 of the LED 1160 overlaps the reflective layer 1183 on the adhesive layer 1117. The n-type layer 1161 may be formed by implanting an n-type impurity into a gallium nitride having excellent crystallinity. The active layer 1162 is disposed on the n-type layer 1161. The active layer 1162, which is a light emitting layer that emits light in the LED 1160, may be made of a nitride semiconductor, for example, an indium gallium nitride. The p-type layer 1163 is disposed on the active layer 1162. The p-type layer 1163 may be formed by implanting a p-type impurity into a gallium nitride. However, the materials composing the n-type layer 1161, the active layer 1162, and the p-type layer 1163 are not limited thereto.

The p-electrode 1164 is disposed on the p-type layer 1163 of the LED 1160. The n-electrode 1165 is disposed on the n-type layer 1161 of the LED 1160. The n-electrode 1165 is spaced apart from the p-electrode 1164. In detail, the LED 1160 may be manufactured by sequentially stacking the n-type layer 1161, the active layer 1162, and the p-type layer 1163, etching a predetermined portion of the active layer 1162 and the p-type layer 1163, and then forming the n-electrode 1165 and the p-electrode 1164. The predetermined portion is a space for spacing the n-electrode 1165 and the p-electrode 1164 and the predetermined portion may be etched to expose a portion of the n-type layer 1161. In other words, the surface of the LED 1160 where the n-electrode 1165 and the p-electrode 1164 are disposed is not a planarized surface and may have different height levels. Accordingly, the p-electrode 1164 is disposed on the p-type layer 1163, the n-electrode 1165 is disposed on the n-type layer 1161, and the p-electrode 1164 and the n-electrode 1165 are spaced from each other at different height levels. Therefore, the n-electrode 1165 may be disposed adjacent to the reflectively layer 1183 in comparison to the p-electrode 1164. The n-electrode 1165 and p-electrode 1164 may be made of a conductive material, for example, a transparent conductive oxide. Alternatively, the n-electrode 1165 and p-electrode 1164 may be made of the same material, but are not limited thereto.

A planarization layer 115 is disposed on the inter-layer insulating layer 114 and the adhesive layer 118. The planarization layer 115 is a layer that planarizes the surface of the top of the transistor 150. The planarization layer 115 may be disposed in an area excepting the area where the LED 1160 is disposed while planarizing the surface of the top of the transistor 150. The planarization layer 115 may be composed of two or more layers.

A first electrode 1181 and a second electrode 1182 are disposed on the planarization layer 115. The first electrode 1181 is an electrode that electrically connects the transistor 150 and the LED 1160. The first electrode 1181 is connected with the p-electrode 1164 of the LED 1160 through a contact hole formed at the planarization layer 115. The first electrode 1181 is connected with the drain electrode 154 of the transistor 150 through contact holes formed at the planarization layer 115. However, the first electrode 1181 is not limited thereto and may be connected with the source electrode 153 of the transistor 150, depending on the type of the transistor 150. The p-electrode 1164 of the LED 1160 and the drain electrode 154 of the transistor 150 may be electrically connected by the first electrode 1181.

The second electrode 1182 is an electrode that electrically connects the LED 1160 and the common line CL. In detail, the second electrode 1182 is connected with the common line CL through contact holes formed at the planarization layer 115 and the inter-layer insulating layer 114 and is connected with the n-electrode 1165 of the LED 1160 through a contact hole formed at the planarization layer 115. Accordingly, the common line CL and the n-electrode 1165 of the LED 1160 are electrically connected.

When a stretchable display device 1100 is turned on, voltages having different levels may be supplied respectively to the drain electrode 154 of the transistor 150 and the common line CL. The voltage that is applied to the drain electrode 154 of the transistor 150 may be applied to the first electrode 1181 and a common voltage may be applied to the second electrode 1182. Voltages having different levels may be applied to the p-electrode 1164 and the n-electrode 1165 through the first electrode 1181 and the second electrode 1182, so the LED 1160 can emit light.

Although the transistor 150 is electrically connected with the p-electrode 1164 and the common line CL is electrically connected with the n-electrode 1165 in the description referring to FIG. 11, they are not limited thereto. That is, the transistor 150 may be electrically connected with the n-electrode 1165 and the common line CL may be electrically connected with the p-electrode 1164.

A bank 116 is disposed on the planarization layer 115, the first electrode 1181, the second electrode 1182, the data pad 173, and the connecting pad 172. The bank 116 is disposed to overlap an end of the reflective layer 1183 and a portion not overlapped with the bank 116 of the reflective layer 1183 may be defined as a light emitting area. The bank 116 may be made of an organic insulating material and may be made of the same material as the planarization layer 115. The bank 116 may include a black material to suppress mixing of colors due to light emitted from the LED 1160 and transmitted to an adjacent subpixel SPX.

The stretchable display device 1100 according to another embodiment of the present disclosure includes the LED 1160. Since the LED 1160 is made of not an organic material, but an inorganic material, reliability is high, so the lifespan is longer than that of a liquid crystal display element or an organic light emitting element. The LED 1160 is quickly turned on, consumes a small amount of power, has high stability because it has high shock-resistance, and can display high-luminance images because it has high emission efficiency. Accordingly, the LED 1160 is an element that is suitable to be applied even to very large screens. In particular, since the LED 1160 is made of not an organic material, but an inorganic material, an encapsulation layer that is required when an organic light emitting element is used may not be used. Accordingly, the encapsulation layer that may be easily damaged, such as cracking, when the stretchable display device 1100 is stretched may not be provided. Accordingly, it is possible not to use an encapsulation layer that may be damaged when the stretchable display device 1100 according to another embodiment of the present disclosure is deformed such as bending or stretching, by using the LED 1160 as a display element in the stretchable display device 1100. Further, since the LED 1160 is made of not an organic material, but an inorganic material, the display elements of the stretchable display device 1100 according to another embodiment of the present disclosure can be protected from water or oxygen and their reliability may be high.

The exemplary embodiments of the present disclosure can also be described as follows:

According to an aspect of the present disclosure, a stretchable display panel comprises: a lower substrate having an active area and a non-active area surrounding the active area; a plurality of individual substrates disposed on the lower substrate and located in the active area; a connection line electrically connecting a pad disposed on the individual substrate; a plurality of pixels disposed on the plurality of individual substrates; and an upper substrate disposed above the plurality of pixels, wherein the modulus of elasticity of the individual substrates is higher than that of at least one part of the lower substrate.

The connecting line may include a base polymer and conductive particles distributed in the base polymer, the conductive particles forming a conductive path of a straight shape.

The base polymer may be formed as a single layer between adjacent individual substrates on the lower substrate, the conductive particles forming a plurality of conductive path in the single layer of base polymer.

The height of the top surface of the portion of the base polymer overlapped with the plurality of individual substrates and the height of the top surface of the areas of the base polymer disposed between the plurality of individual substrates may be the same.

The conductive particles may be distributed with a density gradient, such that conductivity by conductive particles is maximum at the upper portion of the base polymer.

The lower substrate may include a plurality of first lower areas overlapped with the plurality of individual substrates and a second lower area excepting the plurality of first lower areas, the modulus of elasticity of the first lower areas being higher than that of the second lower area.

The plurality of first lower areas may be made of the same material as the plurality of individual substrates.

The upper substrate may include a plurality of first upper areas overlapped with the plurality of individual substrates and a second upper area excepting the plurality of first upper areas, the modulus of elasticity of the first upper areas being higher than that of the second upper area.

The plurality of first upper areas may be made of the same material as the plurality of first lower areas, and the second upper areas are made of the same material as the second lower areas.

The polarizing layer may include a plurality of polarizing areas overlapped with the plurality of individual substrates and a flexible area excepting the plurality of polarizing areas A modulus of elasticity of the flexible areas may be lower than a modulus of elasticity of the plurality of polarizing area.

The flexible areas may have the same modulus of elasticity as the second lower areas.

The transmittance of the flexible areas may be the same as that of the plurality of polarizing areas.

The adhesive layer may include a plurality of first adhesive areas overlapped with the plurality of individual substrates and a second adhesive area excepting the plurality of adhesive areas.

The transmittance of the second adhesive area may be the same as that of the plurality of polarizing areas.

The stretchable display panel may further comprise a plurality of additional individual substrates disposed in the non-active area, and a gate driving unit may be disposed on the plurality of additional individual substrates, the modulus of elasticity of the plurality of additional individual substrates being lower than that of the lower substrate.

The stretchable display panel may further comprise a low-potential voltage line disposed the lower substrate and the additional individual substrates to surround the edge of the lower substrate and provide a low-potential voltage to the plurality of pixels.

The connecting line may have a curved shape, and the connecting line being made of the same material as at least one of a plurality of conductive components disposed on the plurality of individual substrates.

The stretchable display panel may further comprise a conductive reinforcing member disposed under or on the connecting line.

The conductive reinforcing member may be a base polymer, a conductive polymer, or a liquid metal.

The conductive reinforcing member may be disposed at the inner edge of an area where the amplitude of the connecting line is largest.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display structure comprising:
   a first substrate having a first modulus of elasticity and having an active area and a non-active area adjacent to the active area;
   a plurality of second substrates positioned on the active area of the first substrate and spaced apart from each other, each of the second substrates having a second modulus of elasticity that is greater than first modulus of elasticity;
   a plurality of third substrates positioned on the non-active area of the first substrate and spaced apart from each other, each of the third substrates having a third modulus of elasticity that is greater than first modulus of elasticity;

at least one semiconductor transistor positioned on each of the second substrates of the plurality;

electrically conductive lines extending between respective ones of the second substrates; and a gate driving unit is disposed on the plurality of third substrates.

2. The display structure of claim 1 wherein the second modulus of elasticity is more than one thousand times greater than the first modulus of elasticity.

3. The display structure of claim 1 wherein the electrically conductive lines have a flexible, twisty, wavy shape.

4. The display structure of claim 1 wherein each of the second substrates of the plurality has a light emitting element positioned thereon.

5. The display structure of claim 4 wherein at least one of the electrically conductive lines extending between respective ones of the second substrates is a data line that provides a data signal to the light emitting element on the second substrate.

6. A stretchable display panel, comprising:
a lower substrate having an active area and a non-active area adjacent to the active area;
a plurality of individual substrates disposed on the lower substrate and located in the active area;
a connection line electrically connecting to a pad disposed on the individual substrate;
a plurality of pixels disposed respectively on the plurality of individual substrates; and
an upper substrate disposed above the plurality of pixels,
wherein the modulus of elasticity of the individual substrates is higher than the modulus of elasticity of at least one part of the lower substrate, and
wherein the lower substrate includes a plurality of first lower areas overlapped with the plurality of individual substrates and a second lower area excepting the plurality of first lower areas, the modulus of elasticity of the first lower areas being higher than that of the second lower area.

7. The stretchable display panel of claim 6, wherein the plurality of first lower areas is made of the same material as the plurality of individual substrates.

8. A stretchable display device comprising the stretchable display panel of claim 6.

9. The stretchable display panel of claim 6, further comprising a plurality of additional individual substrates disposed in the non-active area,
wherein a gate driving unit is disposed on the plurality of additional individual substrates, the modulus of elasticity of the plurality of additional individual substrates being lower than that of the lower substrate.

10. The stretchable display panel of claim 9, further comprising a low-potential voltage line disposed the lower substrate and the additional individual substrates to surround the edge of the lower substrate and provide a low-potential voltage to the plurality of pixels.

11. The stretchable display panel of claim 6, wherein the upper substrate includes a plurality of first upper areas overlapped with the plurality of individual substrates and a second upper area excepting the plurality of first upper areas, the modulus of elasticity of the first upper areas being higher than that of the second upper area.

12. The stretchable display panel of claim 11, wherein the plurality of first upper areas is made of the same material as the plurality of first lower areas, and the second upper areas are made of the same material as the second lower areas.

13. The stretchable display panel of claim 6, wherein the connecting line includes a base polymer and conductive particles distributed in the base polymer, the conductive particles forming a conductive path of a straight shape.

14. The stretchable display panel of claim 13, wherein the conductive particles are distributed with a density gradient, such that conductivity by conductive particles is maximum at the upper portion of the base polymer.

15. The stretchable display panel of claim 13, wherein the base polymer is formed as a single layer between adjacent individual substrates on the lower substrate, the conductive particles forming a plurality of conductive paths in the single layer of base polymer.

16. The stretchable display panel of claim 15, wherein the height of the top surface of the portion of the base polymer overlapped with the plurality of individual substrates and the height of the top surface of the areas of the base polymer disposed between the plurality of individual substrates is the same.

17. The stretchable display panel of claim 6, wherein the connecting line has a curved shape, and the connecting line being made of the same material as at least one of a plurality of conductive components disposed on the plurality of individual substrates.

18. The stretchable display panel of claim 17, further comprising a conductive reinforcing member disposed under or on the connecting line.

19. The stretchable display panel of claim 18, wherein the conductive reinforcing member is disposed at the inner edge of an area where the amplitude of the connecting line is largest.

20. The stretchable display panel of claim 18, wherein the conductive reinforcing member is a base polymer, a conductive polymer, or a liquid metal.

21. The stretchable display panel of claim 6, further comprising a polarizing layer disposed adjacent to the upper substrate,
wherein the polarizing layer includes a plurality of polarizing areas overlapped with the plurality of individual substrates and a flexible area excepting the plurality of polarizing areas.

22. The stretchable display panel of claim 21, wherein a modulus of elasticity of the flexible areas are lower than a modulus of elasticity of the plurality of polarizing area.

23. The stretchable display panel of claim 21, wherein the transmittance of the flexible areas is the same as that of the plurality of polarizing areas.

24. The stretchable display device of claim 21, wherein the flexible areas have the same modulus of elasticity as the second lower areas.

25. The stretchable display panel of claim 21, further comprising an adhesive layer for bonding the lower substrate and the upper substrate,
wherein the adhesive layer includes a plurality of first adhesive areas overlapped with the plurality of individual substrates and a second adhesive area excepting the plurality of adhesive areas.

26. The stretchable display panel of claim 25, wherein the transmittance of the second adhesive area is the same as that of the plurality of polarizing areas.

* * * * *

UNITED STATES PATENT AND TRADEMARK OFFICE
CERTIFICATE OF CORRECTION

Page 1 of 1

PATENT NO. : 11,011,599 B2
APPLICATION NO. : 16/520159
DATED : May 18, 2021
INVENTOR(S) : Eunah Kim et al.

It is certified that error appears in the above-identified patent and that said Letters Patent is hereby corrected as shown below:

On the Title Page

Item (56) References Cited/Foreign Parent Documents:
"CN 10-2017-0088013 A 8/2017" should read: --KR 10-2017-0088013 A 8/2017--

Signed and Sealed this
Twenty-sixth Day of April, 2022

Katherine Kelly Vidal
*Director of the United States Patent and Trademark Office*